United States Patent
Hata et al.

(10) Patent No.: US 9,400,088 B2
(45) Date of Patent: Jul. 26, 2016

(54) LIGHT EMITTING APPARATUS, AND LIGHT IRRADIATION APPARATUS PROVIDED WITH LIGHT EMITTING APPARATUS

(75) Inventors: Toshio Hata, Osaka (JP); Shinji Osaki, Osaka (JP); Toyonori Uemura, Osaka (JP); Shinya Ishizaki, Osaka (JP); Hitoshi Matsushita, Osaka (JP)

(73) Assignee: SHARP KABUSHIKI KAISHA, Osaka-shi, Osaka (JP)

(*) Notice: Subject to any disclaimer, the term of this patent is extended or adjusted under 35 U.S.C. 154(b) by 212 days.

(21) Appl. No.: 14/343,084

(22) PCT Filed: Aug. 21, 2012

(86) PCT No.: PCT/JP2012/071106
§ 371 (c)(1),
(2), (4) Date: Mar. 6, 2014

(87) PCT Pub. No.: WO2013/038878
PCT Pub. Date: Mar. 21, 2013

(65) Prior Publication Data
US 2014/0240976 A1    Aug. 28, 2014

(30) Foreign Application Priority Data
Sep. 16, 2011 (JP) ................ 2011-203663

(51) Int. Cl.
| | |
|---|---|
| *F21V 9/00* | (2015.01) |
| *F21K 99/00* | (2016.01) |
| *H01L 33/50* | (2010.01) |
| *A01G 7/04* | (2006.01) |
| *F21K 2/00* | (2006.01) |
| *H01L 25/075* | (2006.01) |
| *F21Y 101/02* | (2006.01) |
| *F21Y 105/00* | (2016.01) |

(52) U.S. Cl.
CPC . *F21K 9/50* (2013.01); *A01G 7/045* (2013.01); *F21K 2/00* (2013.01); *H01L 33/50* (2013.01); *F21Y 2101/02* (2013.01); *F21Y 2105/003* (2013.01); *H01L 25/0753* (2013.01); *H01L 2224/48247* (2013.01); *Y02P 60/149* (2015.11)

(58) Field of Classification Search
CPC .................................. F21K 9/50; F21K 2/00
See application file for complete search history.

(56) References Cited

U.S. PATENT DOCUMENTS

| | | | |
|---|---|---|---|
| 2004/0201980 A1* | 10/2004 | Fischer | A61B 5/0088 362/84 |
| 2005/0265051 A1* | 12/2005 | Yamamoto | F21S 2/005 362/657 |

(Continued)

FOREIGN PATENT DOCUMENTS

| | | |
|---|---|---|
| JP | 09-252651 | 9/1997 |
| JP | 2004-344114 | 12/2004 |

(Continued)

OTHER PUBLICATIONS

Supplementary European Search Report mailed Jan. 22, 2015 in European Application 12832671.7.
International Search Report for PCT/JP2012/071106 mailed Sep. 18, 2012.
Written Opinion of the International Searching Authority (JP language) mailed Sep. 18, 2012.

*Primary Examiner* — Evan Dzierzynski
(74) *Attorney, Agent, or Firm* — Nixon & Vanderhye, P.C.

(57) ABSTRACT

A light emitting device (1) includes (i) a surface-mounted light emitting section (10a), (ii) a lens section (30) which is provided on a light exit side of the surface-mount light emitting section (10a), and (iii) a frame section (40) which fixes a periphery of the lens section (30). In the surface-mounted light emitting section (10a), a resin layer (17) that contains a red fluorescent material (17b) covers at least one (1) blue LED chip (14a). This allows the surface-mounted light emitting section (10a) to emit (i) light that matches a peak wavelength which falls within a short wavelength range and (ii) light that matches a peak wavelength which falls within a long wavelength range.

7 Claims, 13 Drawing Sheets

(56) References Cited

U.S. PATENT DOCUMENTS

| | | | |
|---|---|---|---|
| 2008/0164484 A1* | 7/2008 | Lee | H01L 25/0753 257/89 |
| 2010/0172131 A1 | 7/2010 | Mo et al. | |
| 2011/0175548 A1* | 7/2011 | Nishimura | F21K 9/00 315/294 |

FOREIGN PATENT DOCUMENTS

| | | |
|---|---|---|
| JP | 2010-004869 | 1/2010 |
| JP | 2011-080248 | 4/2011 |
| JP | 2011-155948 | 8/2011 |
| JP | 2011-180440 | 9/2011 |

* cited by examiner

LIGHT EMITTING APPARATUS, AND LIGHT IRRADIATION APPARATUS PROVIDED WITH LIGHT EMITTING APPARATUS

This application is the U.S. national phase of International Application No. PCT/JP2012/071106 filed 21 Aug. 2012 which designated the U.S. and claims priority to JP 2011-203663 filed 16 Sep. 2011, the entire contents of each of which are hereby incorporated by reference.

TECHNICAL FIELD

The present invention relates to (i) a light emitting device that includes a surface-mounted light emitting section which is mounted on a surface of a wiring substrate and (ii) a light irradiation apparatus that includes the light emitting device.

BACKGROUND ART

Recently, cultivating plants by use of an artificial light source has been keenly studied. Attention has been paid particularly to a method of cultivating plants by illuminating the plants with light of a light emitting device (such as a light emitting diode (LED)) which (i) excels in monochromaticity, (ii) saves energy, (iii) has a long life duration, and (iv) can be downsized.

Patent Literature 1 cited below discloses a plant growing device as an example of a conventional light emitting device which can be used in a factory etc. where living organisms are grown, for example, living organisms are cultivated or cultured.

A plant growing device 100 (see FIG. 10), disclosed in Patent Literature 1, includes (i) a light emitting section 110 for emitting light which is used to grow a plant, (ii) an electric power supplying section 120 for supplying electric power to the light emitting section 110 so that the light emitting section 110 can emit light whose spectrum is changeable, (iii) a determining section 131 for determining kinds of plant 101 to be grown, and (iv) a growth light setting section 132 for setting a spectrum of light by controlling the electric power supplying section 120 in accordance with the kinds of plant 101 which has been determined by the determining section 131.

The light emitting section 110 includes a substrate 111 in a plate shape (see FIG. 11). The substrate 111 has a surface on which various LEDs 112 for emitting light of different spectra are arranged (see FIG. 11). The plant 101 is irradiated with light emitted from the LEDs 112 (see FIG. 10). Each of the LEDs 112 is, for example, in a bullet shape.

Patent Literature 2 cited below discloses (i) an LED light source for plant cultivation and (ii) a plant cultivating vessel with which an LED light source is to be individually combined. Specifically, red LEDs 210 and blue LEDs 220 are provided on one (1) printed board (10 cm×10 cm, thickness: 1.6 mm), and the printed board are combined with a lid 200 (11 cm×11 cm, height: 17 mm) of the plant cultivating vessel (see FIG. 12). The lid 200 itself serves as a light source. The plant cultivating vessel is constituted by (i) a plastic frame 240 and (ii) an air-permeable and transparent resin film 230 (see FIG. 13). A rock wool culture medium 250 is provided in the plant cultivating vessel (see FIG. 13). The lid 200 is fixed to the plastic frame 240 by a fixing lever 260.

CITATION LIST

Patent Literature

Patent Literature 1
Japanese Patent Application Publication, Tokukai, No. 2004-344114 A (Publication Date: Dec. 9, 2004)
Patent Literature 2
Japanese Patent Application Publication, Tokukaihei, No. 9-252651 A (Publication Date: Sep. 30, 1997)
Patent Literature 3
Japanese Patent Application Publication, Tokukai, No. 2011-80248 A (Publication Date: Apr. 21, 2011)

SUMMARY OF INVENTION

Technical Problem

However, according to the configurations described in Patent Literatures 1 and 2, blue LEDs and red LEDs should be two-dimensionally arranged on a substrate so as to become suitable for growing of living organisms, for example, cultivating or culturing of living organisms. This causes an increase in area where a light source is provided.

Moreover, the blue LEDs and the red LEDs, which are two-dimensionally arranged on the substrate, are away from each other. This causes an unsatisfactory color mixture. That is, this causes unevenness of color (unevenness of intensity of composite light of blue light and red light) on an object to be irradiated with the composite light. This ultimately causes, for example, a problem that photosynthetic photon flux does not have a predetermined ratio.

The present invention was made in view of the problems, and an object of the present invention is to provide (i) a light emitting device which (a) does not increase an area where the light emitting device is provided and (b) attains a satisfactory color mixture of blue light and red light, and (ii) a light irradiation apparatus that includes the light emitting device.

Solution to Problem

In order to attain the object, a light emitting device of the present invention is configured to include: at least one (1) surface-mounted light emitting section which is mounted on a surface of a wiring substrate; a lens section which is provided on a light exit side of the at least one surface-mounted light emitting section; and a frame section which fixes a periphery of the lens section, the at least one surface-mounted light emitting section including: at least one (1) first LED chip which emits first light that matches a first peak wavelength of a plurality of peak wavelengths of light that is to be absorbed by living organisms that require light to grow, the first peak wavelength falling within a relatively short wavelength range; and a sealing resin, containing a fluorescent material, which is provided so as to cover the at least one first LED chip, the fluorescent material absorbing the first light, which is emitted by the at least one first LED chip, so as to emit third light that matches a third peak wavelength of the plurality of peak wavelengths, the third peak wavelength falling within a relatively long wavelength range.

According to the configuration, the light emitting device of the present invention includes (i) the at least one surface-mounted light emitting section, (ii) the lens section which is provided on the light exit side of the at least one surface-mounted light emitting section, and (iii) the frame section which fixes the periphery of the lens section. The at least one surface-mounted light emitting section includes (i) the at least one first LED chip, and (ii) the sealing resin, containing the fluorescent material that is dispersed therein, which sealing resin is provided so as to cover the at least one first LED chip. The at least one first LED chip emits the first light that matches the first peak wavelength which falls within the short wavelength range (for example, a blue range). The fluorescent material emits, in response to the first light emitted by the at least one first LED chip, the third light that matches the third peak wavelength which falls within the long wavelength range (for example, a red range). The first light and the third light are converged by the lens section so that brightness is increased in front of the lens section, and exit from the lens section.

Consequently, it is unnecessary to use two kinds of LED chip, that is, an independent blue LED chip and an independent red LED chip. By using a single kind of LED chip, it is possible to emit (i) light (the first light) that matches the first peak wavelength which falls within the short wavelength range and (ii) light (the third light) that matches the third peak wavelength which falls within the long wavelength range, the first light and the third light being necessary for growth of living organisms. This can bring about the following effects (1) through (3).

(1) Since only a single kind of LED chip is used, it is possible to reduce an area where the at least one surface-mounted light emitting section occupy, as compared with a conventional case where two kinds of LED chip are used.

(2) Since (i) the fluorescent material is dispersed in the sealing resin and (ii) the sealing resin covers the at least one first LED chip, color mixture of the first light and the third light is satisfactory, as compared with a conventional case where various LED chips are away from each other. It is therefore possible to effectively prevent unevenness of color (unevenness of intensity of composite light of the first light and the third light) from occurring with respect to an object to be irradiated with light. For example, a problem can be easily solved in which photosynthetic photon flux does not have a calculated ratio.

(3) The fluorescent material can be dispersed in the sealing resin at a predetermined mixture ratio. It is therefore possible to change, in accordance with the predetermined mixture ratio, (i) quantity of light having a wavelength in the short wavelength range and (ii) quantity of light having a wavelength in the long wavelength range.

The light emitting device of the present invention includes a lens. The first light and the third light are converged by the lens, and exit from the lens. Thus, brightness can be increased in front of the lens. It is therefore possible to solve a problem that a conventional light emitting device has an insufficient brightness in front of the conventional light emitting device.

Therefore, it is possible to provide (i) a light emitting device which (a) does not increase an area where the light emitting device is provided and (b) attains a satisfactory color mixture of blue light and red light with a simple configuration, and (ii) a light irradiation apparatus including the light emitting device.

Advantageous Effects of Invention

A light emitting device of the present invention is configured to include: at least one (1) surface-mounted light emitting section which is mounted on a surface of a wiring substrate; a lens section which is provided on a light exit side of the at least one surface-mounted light emitting section; and a frame section which fixes a periphery of the lens section, the at least one surface-mounted light emitting section including: at least one (1) first LED chip which emits first light that matches a first peak wavelength of a plurality of peak wavelengths of light that is to be absorbed by living organisms that require light to grow, the first peak wavelength falling within a short wavelength range; and a sealing resin, containing a fluorescent material, which is provided so as to cover the at least one first LED chip, the fluorescent material absorbing the first light, which is emitted by the at least one first LED chip, so as to emit third light that matches a third peak wavelength of the plurality of peak wavelengths, the third peak wavelength falling within a long wavelength range.

A light irradiation apparatus of the present invention is configured to include the above-described light emitting device as a light source for growing of living organisms, the growing including cultivation or culturing.

Therefore, it is possible to provide (i) a light emitting device which (a) does not increase an area where the light emitting device is provided and (b) attains a satisfactory color mixture of blue light and red light with a simple configuration, and (ii) a light irradiation apparatus including the light emitting device.

DESCRIPTION OF EMBODIMENTS

[Embodiment 1]

Figure 1:
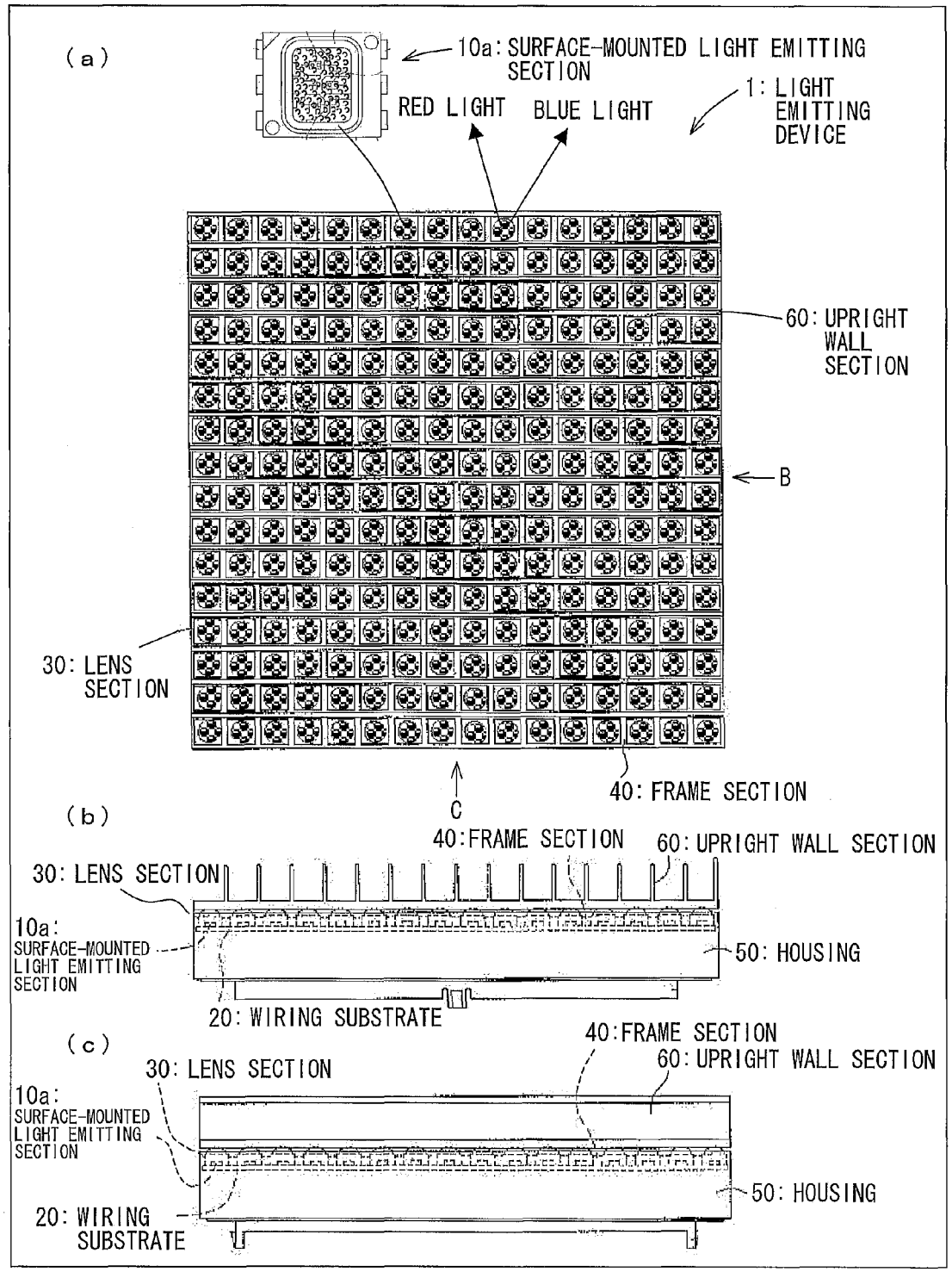
FIG. 1 is an explanatory view illustrating a configuration of a light emitting device according to Embodiment 1. (a) of FIG. 1 is an elevation view illustrating a main part of the configuration of the light emitting device. (b) of FIG. 1 is a side view illustrating the light emitting device which is viewed from a direction of an arrow B illustrated in (a) of FIG. 1. (c) of FIG. 1 is a side view illustrating the light emitting device which is viewed from a direction of an arrow C illustrated in (a) of FIG. 1.
Figure 2:
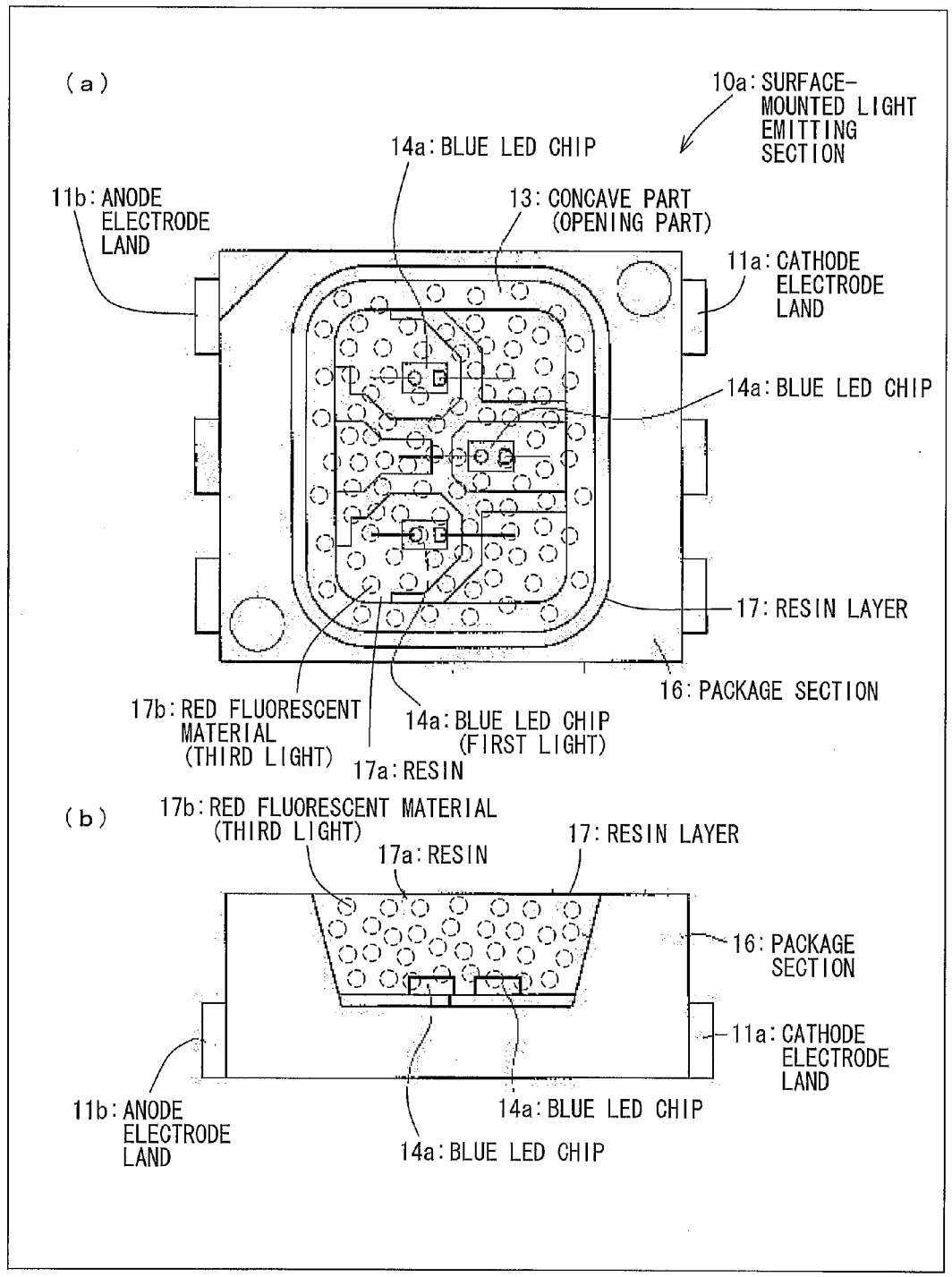
FIG. 2 is an explanatory view illustrating a configuration of a surface-mounted light emitting section according to Embodiment 1. (a) of FIG. 2 is a plan view illustrating a main part of the configuration of the surface-mounted light emitting section. (b) of FIG. 2 is a perspective side view illustrating the main part of the configuration of the surface-mounted light emitting section.
Figure 3:
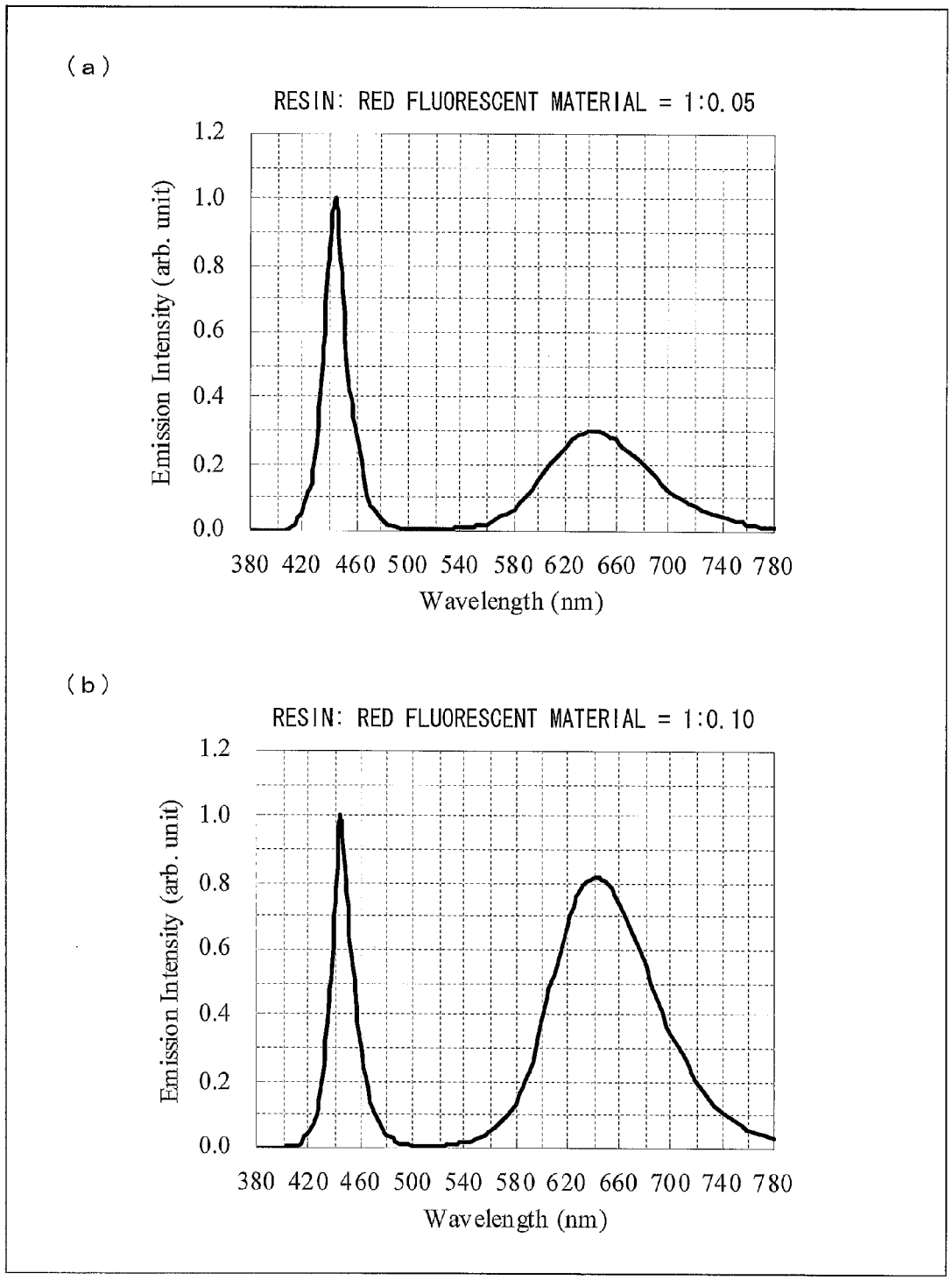
FIG. 3 is a graph illustrating emission spectra of the surface-mounted light emitting section. (a) of FIG. 3 is a graph illustrating an emission spectrum obtained in a case where a mixture ratio between resin and red fluorescent material is 1:0.05. (b) of FIG. 3 is a graph illustrating an emission spectrum obtained in a case where the mixture ratio between resin and red fluorescent material is 1:0.10.

The following description will discuss Embodiment 1 of the present invention with reference to FIGS. 1 through 3.

(Light Emitting Device)

A configuration of a light emitting device 1 of Embodiment 1 will be described below with reference to FIG. 1. FIG. 1 is an explanatory view illustrating the configuration of the light emitting device 1 of Embodiment 1. (a) of FIG. 1 is an elevation view illustrating a main part of the configuration of the light emitting device 1 of Embodiment 1. (b) of FIG. 1 is a side view illustrating the light emitting device 1 which is viewed from a direction of an arrow B illustrated in (a) of FIG. 1. (c) of FIG. 1 is a side view illustrating the light emitting device 1 which is viewed from a direction of an arrow C illustrated in (a) of FIG. 1.

The light emitting device 1 of Embodiment 1 has a shape of a typical surface-mounted light emitting device (for example, a quadrangular shape). The light emitting device 1 includes a surface-mounted light emitting section 10a, a wiring substrate 20, lens sections 30, a frame section 40, a housing 50, and upright wall sections (visor sections) 60 (see FIG. 1).

A plurality of surface-mounted light emitting sections 10a are provided, in a matrix manner, on the wiring substrate 20.

The lens sections 30 are provided on a light exit side (front side) of the respective plurality of surface-mounted light emitting sections 10a (that is, the lens sections 30 are provided so as to face the respective plurality of surface-mounted light emitting sections 10a). Lights which enter the respective lens sections 30 are converged by the lens sections 30 in a direction of the front side of the plurality of surface-mounted light emitting sections 10a. Then, the lights exit from the lens sections 30. Since the lights emitted from the plurality of surface-mounted light emitting sections 10a are thus converged, the light emitting device 1 brings about an effect of increasing brightness in front of the lens sections 30. Therefore, according to the light emitting device 1, a state where the light emitting device 1 is emitting light can be clearly distinguished from a state where the light emitting device 1 is not emitting light.

The frame section 40 has a lattice shape so as to correspond to the plurality of surface-mounted light emitting sections 10a. The frame section 40 is provided so as to surround and fix each of the lens sections 30. The lens sections 30 are provided for respective compartments of the frame section 40.

Note that the lens sections 30 and the frame section 40 can be integrated with each other so as to serve as a lens module. This allows a connection structure to be simplified. It is therefore possible to improve (i) workability during connecting (mounting) or exchanging on a maintenance work and (ii) reliability.

Note here that how the lens sections 30 and the frame section 40 are integrated with each other is not limited to a specific method, provided that the lens sections 30 and the frame section 40 constitute a lens module. For example, a resin material is molded so that the lens sections 30 and the frame section 40 are integrated with each other. Alternatively, the lens sections 30 can be fitted in the respective compartments of the frame section 40.

The wiring substrate 20 is attached to the housing 50.

Each of the upright wall sections 60 is a thin plate-like structure which is upright from the frame section 40 toward the light exit side. An upright wall section 60 is provided between respective adjacent surface-mounted light emitting sections 10a provided in a column direction. The upright wall sections 60 are successively provided on a light exit side of the frame section 40 (on the front side of the lens sections 30) and in a direction orthogonal to the column direction. Each of the upright wall sections 60 is provided so as to rotate between (i) a state in which the upright wall section is upright and (ii) a state in which the upright wall section is slanted to a surface of the wiring substrate 20 (see FIG. 14, later described in detail). It is therefore possible to adjust, in accordance with, for example, three-dimensional growth of a plant, an angle at which the plant is irradiated with light. This can bring about an effect of increasing a light irradiation intensity at any stage of growth of the plant. Moreover, in a case where a plurality of living organisms to be grown are (i) arranged on a horizontal plane and (ii) irradiated with light, it is possible to adjust angles at which the respective plurality of living organisms are irradiated with light, as appropriate in accordance with the arrangements of the respective plurality of living organisms. Note that how to adjust an angle of each of the upright wall sections 60 is not limited to a specific adjusting method. Each angle of the upright wall sections 60 can be manually adjusted in accordance with a growth characteristic of a corresponding living organism. It is preferable to change each angle of the upright wall sections 60 about every several days.

The housing 50 can have an engagement section (not illustrated) via which the light emitting device 1 is easily attached to an electronic device.

Note that details of the surface-mounted light emitting sections 10a will be later described.

According to Embodiment 1, 256 surface-mounted light emitting sections 10a (16 surface-mounted light emitting sections 10a in each row, and 16 surface-mounted light emitting sections 10a in each column) are mounted on the wiring substrate 20 in a dot matrix manner of 16 rows and 16 columns (see (a) of FIG. 1). One of the upright wall sections 60 is provided along external end parts of surface-mounted light emitting sections 10a which are arranged in the first row of the 16 rows. Note that an upright wall section 60 is provided between respective adjacent rows. That is, 16 upright wall sections 60 in total are provided for the respective 16 rows.

Note, however, that the number of surface-mounted light emitting sections 10a is not necessarily limited to two or more, and can therefore be one (1). Even in a case where the number of surface-mounted light emitting sections 10a is two or more, the number of surface-mounted light emitting sections 10a is not limited to 256. Note also that how a plurality of surface-mounted light emitting sections 10a are arranged is not limited to the dot matrix manner, and can therefore be any pattern in accordance with specifications of light irradiation of a light emitting device to be used.

(Surface-Mounted Light Emitting Section)

The following description will discuss, with reference to FIG. 2, a surface-mounted light emitting section 10a, of Embodiment 1, which is included in the light emitting device 1.

FIG. 2 is an explanatory view illustrating a configuration of the surface-mounted light emitting section 10a of Embodiment 1. (a) of FIG. 2 is a plan view illustrating a main part of the configuration of the surface-mounted light emitting section 10a. (b) of FIG. 2 is a perspective side view illustrating the main part of the configuration of the surface-mounted light emitting section 10a.

The surface-mounted light emitting section 10a has cathode electrode lands 11a and anode electrode lands 11b, each of which serves as an external terminal for surface mounting (see FIG. 2). The surface-mounted light emitting section 10a includes (i) a package section 16, (ii) a concave part 13 provided in the package section 16, (iii) a resin layer 17 (a sealing resin that contains a fluorescent material), and (iv) a plurality of blue LED chips 14a (first LED chip), for example, three blue LED chips 14a (see FIG. 2). The package section 16 is formed in an appropriate shape in accordance with (i) a shape of the surface-mounted light emitting section 10a and (ii) a shape of an opening part of the concave part 13 to be later described. The resin layer 17 is provided in the concave part 13, and is made of silicone resin 17a that contains red fluorescent materials 17b (fluorescent material). The plurality of blue LED chips 14a (for example, three blue LED chips 14a) emit blue light having identical spectra. The resin layer 17 fills in the concave part 13 so as to cover upper parts of the respective plurality of blue LED chips 14a.

Each of the plurality of blue LED chips 14a generates first light that matches a peak wavelength (a first peak wavelength) falling within a range from 400 nm to 480 nm (short wavelength range). The first peak wavelength is one of a plurality of peak wavelengths of light which is absorbed by plants for photosynthesis, the peak wavelength falling within. A first wavelength of the first light matches an absorption peak of chlorophyll in blue region. Each of the red fluorescent materials 17b absorbs light emitted from the plurality of blue LED chips 14a so as to generate third light which matches a third peak wavelength (emission peak) of the plurality of peak wavelengths. The third peak wavelength falls within a range from 620 nm to 700 nm (long wavelength range). A third wavelength of the third light matches an absorption peak of chlorophyll in red region.

With the configuration, it is possible to realize a light emitting device in which the surface-mounted light emitting section 10a can emit light having a wavelength that can match the absorption peaks of chlorophyll.

Consequently, it is unnecessary to use two kinds of LED chip, that is, an independent blue LED chip and an independent red LED chip. By using a single kind of LED chip, it is possible to emit (i) light (the first light) that matches the first peak wavelength which falls within a short wavelength range and (ii) light (the third light) that matches the third peak wavelength which falls within a long wavelength range, the first light and the third light being necessary for growth of plants. This can bring about the following effects (1) through (3).

(1) Since only a single kind of LED chip is used, it is possible to reduce an area where surface-mounted light emitting sections occupy, as compared with a conventional case where two kinds of LED chip are used.

(2) Since (i) the fluorescent materials are dispersed in the sealing resin that contains fluorescent materials and (ii) the sealing resin that contains fluorescent materials covers the first LED chips, color mixture of the first light and the third light is satisfactory, as compared with a conventional case where various LED chips are away from each other. It is therefore possible to effectively prevent unevenness of color (unevenness of intensity of composite light of the first light and the third light) from occurring with respect to an object to be irradiated with light. For example, a problem can be easily solved in which photosynthetic photon flux does not have a calculated ratio.

(3) The fluorescent materials can be dispersed in the sealing resin at a predetermined mixture ratio. It is therefore possible to change, in accordance with the predetermined mixture ratio, (i) quantity of light having a wavelength in the short wavelength range and (ii) quantity of light having a wavelength in the long wavelength range.

Note that the above description has dealt with the case where each of the plurality of blue LED chips 14a generates the first light that matches the first peak wavelength which falls within the range from 400 nm to 480 nm so as to match the absorption peak in blue region. Alternatively, each of the plurality of blue LED chips 14a can further emit light having a wavelength in a blue-ultraviolet range which includes wavelengths of ultraviolet light.

Note also that the above description has dealt with the case where the surface-mounted light emitting section 10a includes three blue LED chips 14a. However, the number of blue LED chips 14a is not necessarily limited to three, provided that the surface-mounted light emitting section 10a includes at least one (1) blue LED chip 14a.

It is preferable that the shape of the concave part 13, serving as the opening part, via which light, that contains the first light and the third light, is emitted, is sort of oblong (a rectangle having transverse short sides and longitudinal long sides) (see (a) of FIG. 2). Such an oblong shape makes it possible to (i) increase quantity of light in a direction parallel to the long sides, (ii) improve color mixture of light in the direction parallel to the long sides, and (iii) increase a light extraction efficiency, as compared with a case where the shape of the opening part of the concave part 13 is an isotropic shape such as a square or a circle.

For example, in a case where the light emitting device 1 is placed so that the direction parallel to the long sides is parallel to the gravity direction, it is possible to irradiate a plant from top to bottom with plentiful light whose color mixture is satisfactory. This brings an advantage to growth of the plant.

(Adjustment of Ratio Between Quantity of Blue Light and Quantity of Red Light)

Figure 4:
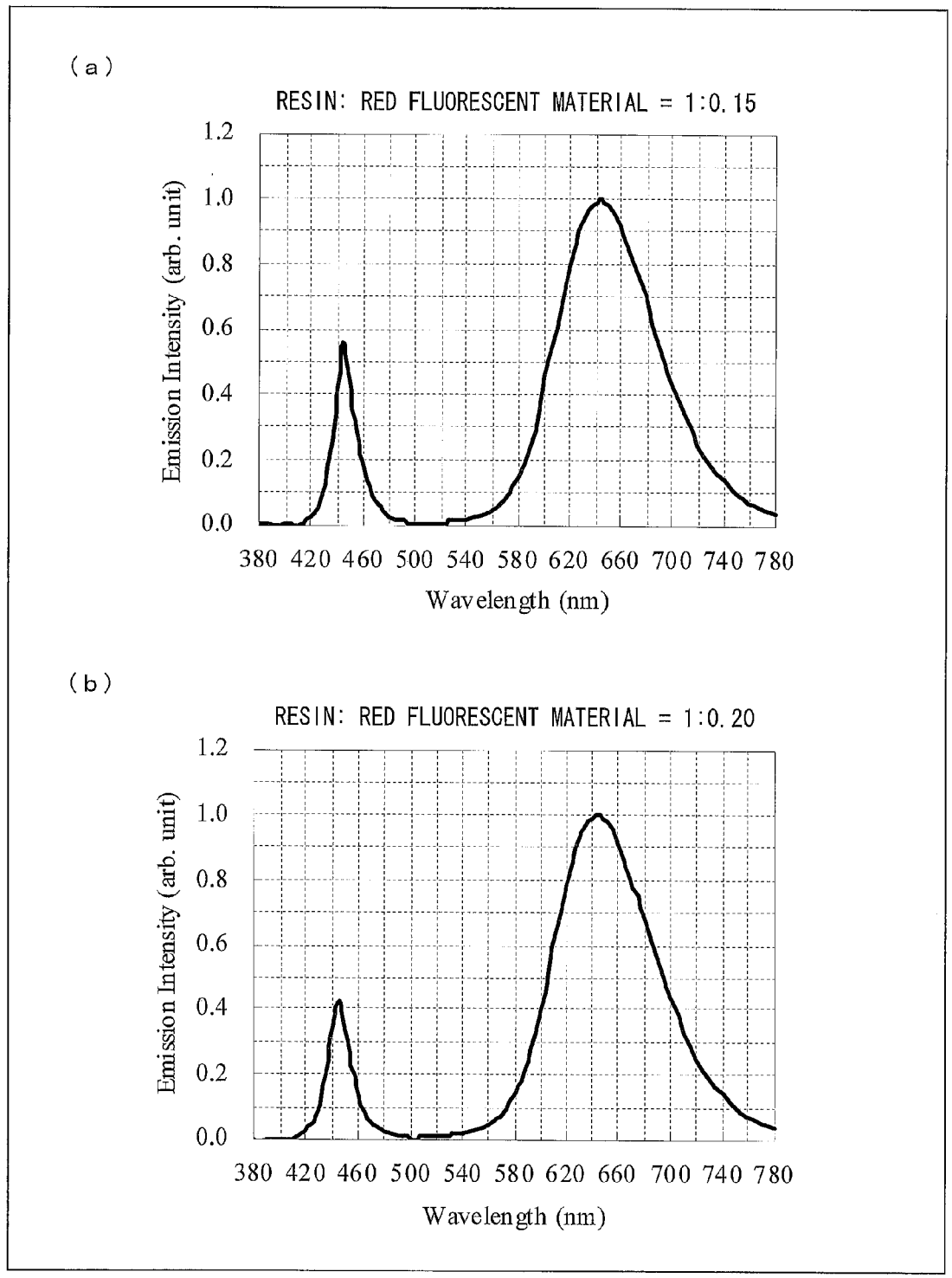
FIG. 4 is a graph illustrating emission spectra of the surface-mounted light emitting section. (a) of FIG. 4 is a graph illustrating an emission spectrum obtained in a case where a mixture ratio between resin and red fluorescent material is 1:0.15. (b) of FIG. 4 is a graph illustrating an emission spectrum obtained in a case where the mixture ratio between resin and red fluorescent material is 1:0.20.

The following description will discuss, with reference to FIGS. 3 and 4, adjustment of a ratio between quantity of blue light and quantity of red light in the surface-mounted light emitting section 10a of Embodiment 1.

FIG. 3 is a graph illustrating emission spectra of the surface-mounted light emitting section 10a. (a) of FIG. 3 is a graph illustrating an emission spectrum obtained in a case where a mixture ratio between resin and red fluorescent material is 1:0.05. (b) of FIG. 3 is a graph illustrating an emission spectrum obtained in a case where the mixture ratio between resin and red fluorescent material is 1:0.10.

FIG. 4 is a graph illustrating emission spectra of the surface-mounted light emitting section 10a. (a) of FIG. 4 is a graph illustrating an emission spectrum obtained in a case where the mixture ratio between resin and red fluorescent material is 1:0.15. (b) of FIG. 4 is a graph illustrating an emission spectrum obtained in a case where the mixture ratio between resin and red fluorescent material is 1:0.20.

Note that each vertical axis of the graphs represents a relative ratio of emission intensity.

According to the surface-mounted light emitting section 10a of Embodiment 1, the resin layer 17 is prepared by causing the resin 17a, made of silicone resin, to contain the red fluorescent materials 17b (see FIG. 2). It is therefore possible to emit lights whose wavelengths are different from each other, by changing a ratio between the silicone resin 17a and the red fluorescent materials 17b.

In a case where, for example, $CaAlSiN_3$:Eu is employed as the red fluorescent materials 17b, as has been described, each of the plurality of blue LED chips 14a emits the first light having the first peak wavelength falling within the range from 400 nm to 480 nm. By adjusting the ratio of the silicone resin 17b to the silicone resin 17a, it is possible to emit the third light having the third peak wavelength which falls within the range from 620 nm to 700 nm. Note that $CaAlSiN_3$:Eu is a nitride red fluorescent material which employs bivalent europium (Eu) as an activator, and $CaAlSiN_3$:Eu is one of fluorescent materials which have stable temperature characteristics and high emission efficiencies.

Specifically, in a case where a mixture ratio between the silicone resin 17a and the red fluorescent materials 17b is 1:0.05 in the surface-mounted light emitting section 10a, an emission spectrum is obtained in which (i) an emission intensity is 1.0 at a peak wavelength of 440 nm and (ii) an emission intensity is 0.3 at a peak wavelength of 640 nm (see (a) of FIG. 3).

In a case where the mixture ratio between the silicone resin 17a and the red fluorescent materials 17b is 1:0.10 in the surface-mounted light emitting section 10a, an emission spectrum is obtained in which (i) an emission intensity is 1.0 at a peak wavelength of 440 nm and (ii) an emission intensity is 0.8 at a peak wavelength of 640 nm (see (b) of FIG. 3).

In a case where the mixture ratio between the silicone resin 17a and the red fluorescent materials 17b is 1:0.15 in the surface-mounted light emitting section 10a, an emission spectrum is obtained in which (i) an emission intensity is 0.56 at a peak wavelength of 440 nm and (ii) an emission intensity is 1.0 at a peak wavelength of 640 nm (see (a) of FIG. 4).

In a case where the mixture ratio between the silicone resin 17a and the red fluorescent materials 17b is 1:0.20 in the surface-mounted light emitting section 10a, an emission spectrum is obtained in which (i) an emission intensity is 0.4 at a peak wavelength of 440 nm and (ii) an emission intensity is 1.0 at a peak wavelength of 640 nm (see (b) of FIG. 4).

The emission spectrum of the surface-mounted light emitting section 10a, in which the mixture ratio between the silicone resin 17a and the red fluorescent materials 17b is 1:0.05, matches the absorption peak of chlorophyll in blue region. It is therefore preferable to use the surface-mounted light emitting section 10a, in which the mixture ratio between the silicone resin 17a and the red fluorescent materials 17b is 1:0.05, to germinate seeds and raise seedlings. Note, however, that a surface-mounted light emitting section 10a to be used to germinate seeds and raise seedlings is not necessarily limited to the surface-mounted light emitting section 10a in which the mixture ratio between the silicone resin 17a and the red fluorescent materials 17b is 1:0.05. Alternatively, it is possible to use the surface-mounted light emitting section 10a in which the mixture ratio between the silicone resin 17a and the red fluorescent materials 17b falls within a range from 1:0.10 to 1:0.15.

The emission spectrum of the surface-mounted light emitting section 10a, in which the mixture ratio between the silicone resin 17a and the red fluorescent materials 17b is 1:0.20, matches the absorption peak of chlorophyll in red region. It is therefore preferable to use the surface-mounted light emitting section 10a, in which the mixture ratio between the silicone resin 17a and the red fluorescent materials 17b is 1:0.20, to cultivate plants. Note, however, that a surface-mounted light emitting section 10a to be used to cultivate plants is not necessarily limited to the surface-mounted light emitting section 10a in which the mixture ratio between the silicone resin 17a and the red fluorescent materials 17b is 1:0.20. Alternatively, it is possible to use the surface-mounted light emitting section 10a in which the mixture ratio between the silicone resin 17a and the red fluorescent materials 17b is 1:0.40.

It is thus possible to easily adjust the ratio between quantity of blue light and quantity of red light, by changing the mixture ratio between the silicone resin 17a and the red fluorescent materials 17b.

(Wavelength of Light Necessary for Growth of Plants)

Figure 5:
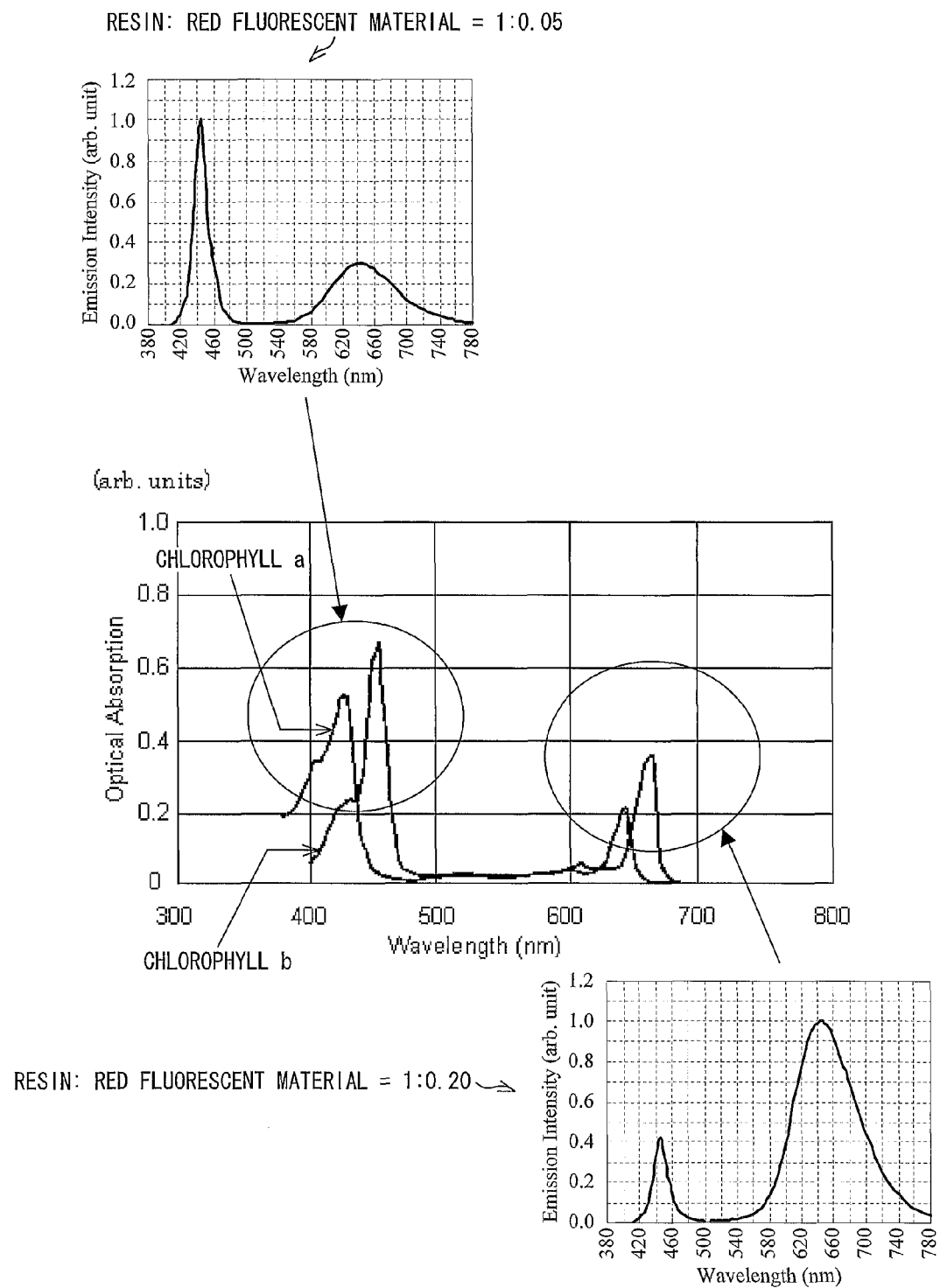
FIG. 5 is a view illustrating (i) light absorbency of chlorophyll and (ii) an emission spectrum of the surface-mounted light emitting section of Embodiment 1.

The following description will discuss, with reference to FIG. 5, wavelengths of light with which plants should be irradiated to grow. FIG. 5 is a view illustrating (i) light absorbency of chlorophyll and (ii) an emission spectrum of the surface-mounted light emitting section 10a of Embodiment 1.

Chlorophyll, which plays a main role in photosynthesis of plants, does not absorb light uniformly, but has specific absorption peaks (i) in the vicinity of 660 nm in red region and (ii) in the vicinity of 450 nm in blue region (see FIG. 5). In connection with the absorption peaks, photosynthesis has a wavelength characteristic in which (i) a first peak is in the vicinity of 660 nm and (ii) a second peak is in the vicinity of 450 nm.

In contrast, as is clear from FIG. 5, the surface-mounted light emitting section 10a of Embodiment 1, in which the mixture ratio between the silicone resin 17a and the red fluorescent materials 17b is 1:0.05 (see (a) of FIG. 3), is suitable for a blue absorption range of chlorophyll. As is also clear from FIG. 5, the surface-mounted light emitting section 10a, in which the mixture ratio between the silicone resin 17a and the red fluorescent materials 17b is 1:0.20 (see (b) of FIG. 4), is suitable for a red absorption range of chlorophyll. Note, however, that the above is illustrative only. Another applicable examples are as follows. In addition to the surface-mounted light emitting section 10a illustrated in (a) of FIG. 3, for example, the surface-mounted light emitting section 10a illustrated in (b) of FIG. 3 (the mixture ratio between the silicone resin 17a and the red fluorescent materials 17b is 1:0.10) is also suitable for the blue absorption range of chlorophyll. In addition to the surface-mounted light emitting section 10a illustrated in (b) of FIG. 4, for example, (i) the surface-mounted light emitting section 10a illustrated in (b) of FIG. 3 and (ii) the surface-mounted light emitting section 10a illustrated in (a) of FIG. 4 (the mixture ratio between the resin 17a and the red fluorescent material 17b is 1:0.10 to 0.15) are also suitable for the red absorption range of chlorophyll.

According to the surface-mounted light emitting section 10a of Embodiment 1, it is thus possible to easily match between the emission peak and the light absorbent characteristic of chlorophyll, merely by changing the mixture ratio between the resin 17a and the red fluorescent material 17b.

In the optical field, for example, photon flux density is employed as a unit of light quantity. What is meant by "photon flux density" is a value calculated by dividing, by a light receiving area of an object, the number of photons with which the object is irradiated by the sun per second. Note, however, that, since the number of photons is counted so as to calculate a photon flux density, one (1) photon of infrared light is equal in light quantity to one (1) photon of ultraviolet light.

A photochemical reaction is caused only when a pigment receives a photon which can be absorbed by the pigment. For example, even in a case where a plant receives light which is not absorbed by chlorophyll of the plant, such light means nothing to plants.

Therefore, in the field of photosynthesis, a photosynthetic photon flux density or a photosynthetic photon flux is defined only in a wavelength range of light from 400 nm to 700 nm which can be absorbed by chlorophyll.

Note that a photosynthetic photon flux is calculated by multiplying a photosynthetic photon flux density (PPFD) by a light irradiated area. The photosynthetic photon flux thus calculated is not merely expressed through an energy corresponding to absorption peak wavelengths of chlorophyll in red and blue regions, but indicates that an energy, corresponding to each of a red absorption spectrum and a blue absorption spectrum (that is, an energy necessary for photosynthesis), is expressed by the number of photons so that a light intensity required for growth of a plant is calculated on the basis of the number of photons. Note also that the photosynthetic photon flux can be calculated on the basis of (i) a spectrum characteristic of light emitted from the surface-mounted light emitting section 10a and (ii) an energy of one (1) photon for each wavelength.

In a case where the surface-mounted light emitting section 10a is expressed by use of the photosynthetic photon flux, the surface-mounted light emitting section 10a illustrated in (a) of FIG. 3 is expressed by (i) a first photosynthetic photon flux of 1 μmol/s in a blue range where a wavelength falls within a range from 400 nm to 480 nm and (ii) a second photosynthetic photon flux of 1.3 μmol/s in a red range where a wavelength falls within a range from 620 nm to 700 nm. The first photosynthetic photon flux (the second photosynthetic photon flux) is calculated on the basis of an area of the graph which illustrates an emission spectrum in a wavelength range from 400 nm to 480 nm and in a wavelength range from 620 nm to 700 nm). This means that a ratio between the first photosynthetic photon flux and the second photosynthetic photon flux is 1:1.3.

The surface-mounted light emitting section 10a illustrated in (b) of FIG. 4 is expressed by (i) a first photosynthetic photon flux of 0.2 μmol/s in the blue range from 400 nm to 480 nm and (ii) a second photosynthetic photon flux of 2.0 μmol/s in the red range from 620 nm to 700. This means that a ratio between the first photosynthetic photon flux and the second photosynthetic photon flux is 1:10. The surface-mounted light emitting section 10a illustrated in (b) of FIG. 4 generates light that contains more red light. Therefore, the surface-mounted light emitting section 10a illustrated in (b) of FIG. 4 is suitably used to promote growth of algae.

As to the surface-mounted light emitting section 10a illustrated in (b) of FIG. 3, a ratio between (i) a photosynthetic photon flux in the blue range from 400 nm to 480 nm and (ii) a photosynthetic photon flux in the red range from 620 nm to 700 is 1:3.5. As to the surface-mounted light emitting section 10a illustrated in (a) of FIG. 4, a ratio between (i) a photosynthetic photon flux in the blue range from 400 nm to 480 nm and (ii) a photosynthetic photon flux in the red range from 620 nm to 700 is 1:7.5.

According to Embodiment 1, the ratio between (i) the photosynthetic photon flux in the blue range from 400 nm to 480 nm and (ii) the photosynthetic photon flux in the red range from 620 nm to 700 falls within a range from 1:1.3 to 1:10. Therefore, it is possible to provide the surface-mounted light emitting section 10a suitable for germination of plants, raising of seedlings of plants, and cultivation of plants.

EXAMPLE

Figure 6:
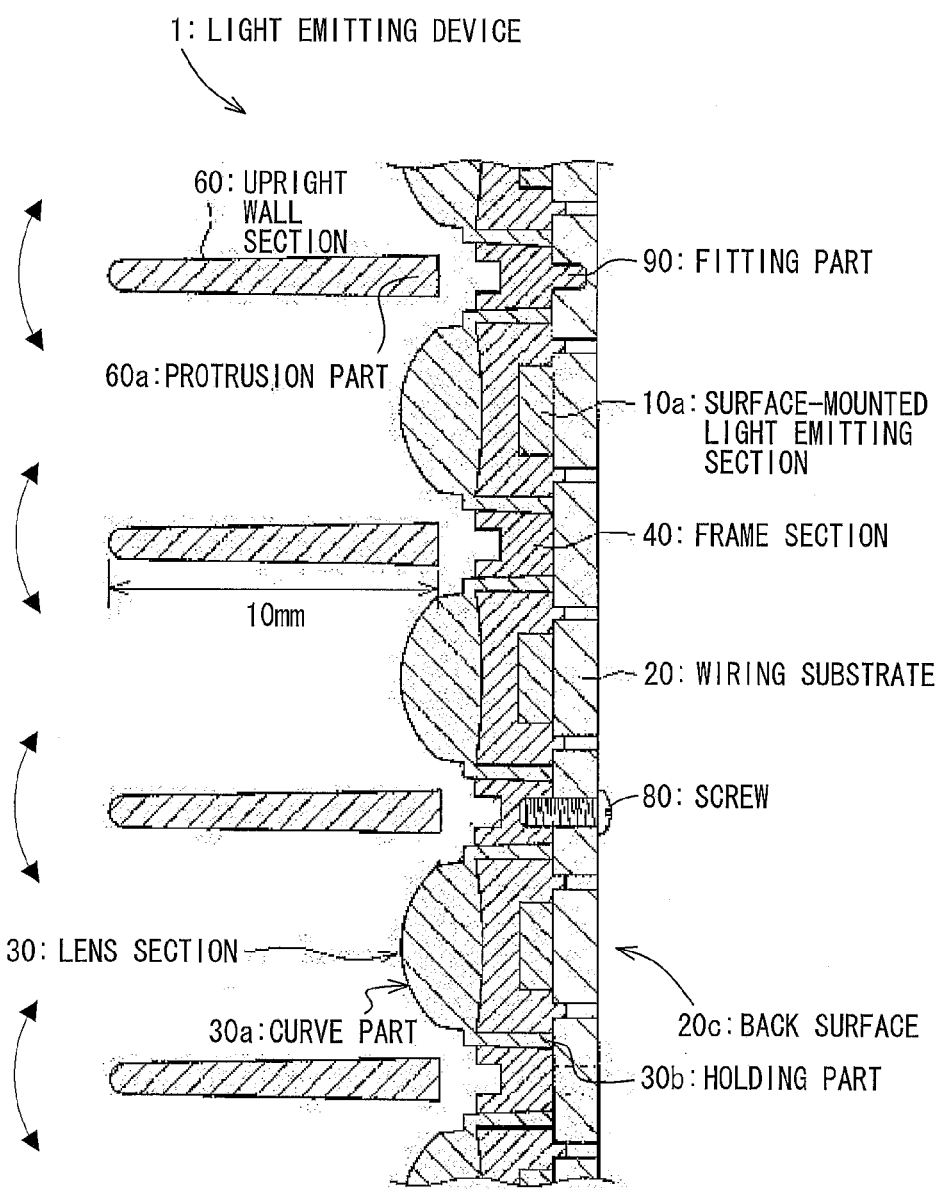
FIG. 6 is a partially enlarged cross-sectional view illustrating an example of a state where the surface-mounted light emitting sections of Embodiment 1 are mounted on a wiring substrate.

The following description will discuss, with reference to FIG. 6, how surface-mounted light emitting sections 10a are mounted on a wiring substrate 20.

FIG. 6 is a partially enlarged cross-sectional view illustrating an example of a state where surface-mounted light emitting section 10a are mounted on a wiring substrate 20.

(1. Surface-Mounted Light Emitting Section 10a)

Since each of the surface-mounted light emitting sections 10a has cathode electrode lands 11a and anode electrode lands 11b, each of which serves as an external terminal for surface mounting (see FIG. 2), each of the surface-mounted light emitting sections 10a is mounted on (connected to) a surface of the wiring substrate 20 as it is. This allows a connection structure to be simplified. It is therefore possible to improve (i) workability during connecting (mounting) and (ii) reliability.

Since each of the surface-mounted light emitting sections 10a is a surface-mount type, a height of each of the surface-mounted light emitting sections 10a on the wiring substrate 20 is equal to that of a corresponding package section 16 (see (b) of FIG. 2). This allows a reduction in thickness of each of the surface-mounted light emitting sections 10a.

The height of each of the surface-mounted light emitting sections 10a is, for example, 1.4 mm. In this case, the height of each of the surface-mounted light emitting sections 10a which have been mounted on the surface of the wiring substrate 20 is 1.4 mm from the surface of the wiring substrate 20. It is therefore possible to reduce a thickness of the light emitting device 1 by employing the surface-mounted light emitting sections 10a.

A weight of each of the surface-mounted light emitting sections 10a is, for example, 0.025 g (gram). It is therefore possible to reduce a weight of the light emitting device 1, by employing the surface-mounted light emitting sections 10a.

Moreover, each of the surface-mounted light emitting sections 10a has an advantage in cost (see Table 1 below). It is therefore possible to reduce a cost of the light emitting device 1. This ultimately allows a reduction in cost of installing a light emitting device, in a case where the light emitting device 1 is employed as the light emitting device.

Note that, in FIG. 6, the wiring substrate 20 is not divided into parts for the respective surface-mounted light emitting sections 10a, but has an integral structure across the light emitting device 1.

(2. Wiring Substrate 20)

The wiring substrate 20 has, for example, a rectangular shape of 160 mm×160 mm when viewed from above. The wiring substrate 20 has a thickness of, for example, 1 mm. The surface-mounted light emitting sections 10a are arranged in the dot matrix manner of 16 rows and 16 columns at intervals of 10 mm both in the row direction and in the column direction.

The wiring substrate 20 has a wiring pattern (not illustrated) which causes the surface-mounted light emitting sections 10a to be arranged on and fixed (connected) to the wiring substrate 20. That is, the cathode electrode lands 11a and the anode electrode lands 11b, each of which serves as an external terminal, are electrically and mechanically connected to the wiring substrate 20 (wiring pattern) via an electrically-conductive member such as soldering. A driving circuit (not illustrated) is mounted on a back surface 20c of the wiring substrate 20, which back surface 20c is opposite to a light exit surface. The driving circuit supplies electric power to the surface-mounted light emitting sections 10a via the wiring pattern.

A frame section 40, which having a lattice shape across the light emitting device 1, can be fixed to the wiring substrate 20 by use of a screw 80. Note that, in order to more securely and stably fix the frame section 40 to the wiring substrate 20, a fitting part 90 of the frame section 40 can be further provided so as to be fitted into the wiring substrate 20 (see FIG. 6), in addition to fixing of the frame section 40 to the wiring substrate 20 by use of the screw 80.

The wiring substrate 20 preferably has a high mechanical strength and less deforms thermally. Specifically, a printed board made of a material such as an insulating synthetic resin, ceramics, glass, or an aluminum alloy, that is, a rigid substrate can be suitably employed as the wiring substrate 20.

(3. Lens Section 30)

Each lens section 30 of Embodiment 1 has (i) a curve part 30a (a member having a curve surface) having a converging characteristic of a convex lens and (ii) a holding part 30b which extends from the curve part 30a to the frame section 40 so as to hold the curve part 30a. According to an example illustrated in FIG. 6, the holding part 30b is configured to protrude from a periphery of the curve part 30a and to fit in a groove part provided in a rectangular and circular manner for each compartment of the frame section 40.

Examples of a lens material for the each lens section 40 include polycarbonate resin. Note, however, that the lens material is not limited to such a material. A moldable resin material, such as acrylic resin, can alternatively be employed as the lens material. As has been described, identical resin materials can be molded so that the lens sections 30 and the frame section 40 are integrated with each other.

Note that weather-resistant polycarbonate is preferably employed as the polycarbonate resin.

(4. Upright Wall Section 60)

Upright wall sections 60 are arranged so as to correspond to the surface-mounted light emitting sections 10 (more specifically, the surface-mounted light emitting sections 10, the lens sections 30, and the frame section 40). The Upright wall sections 60 are arranged so as to correspond to a row direction of the frame section 40. That is, the upright wall sections 60 are arranged for respective 16 rows of the surface-mounted light emitting sections 10a which are included in the light emitting device 1 (see FIG. 1).

Note that the arrangement of the upright wall sections 60 is not limited to such an arrangement of the upright wall sections 60 along the row direction. The upright wall sections 60 can alternatively be arranged along a column direction of the frame section 40. In either arrangement, it is possible to improve illuminance of the light emitting device 1 in a direction of a front surface of the light emitting device 1. Note, however, that, in a case where each of the upright wall sections 60 is configured to rotate, it is possible to increase illuminance in a direction to which a leading end of each of the upright wall sections 60 is directed (later described). Therefore, in a case where the upright wall sections 60 are arranged along the row direction, for example, it is possible to change, in accordance with a part of a plant, illuminance in a direction of a height (from top to bottom) of the plant. In contrast, in a case where the upright wall sections 60 are arranged along the column direction, for example, it is possible to change, in accordance with a part of a plant, illuminance in a direction of a width (left and right) of the plant.

It is preferable that each of the upright wall sections 60 is subjected to a surface treatment for increasing reflectivity, for example, each of the upright wall sections 60 is dyed in color such as whitish color, so that an irradiation efficiency is improved. For example, white polycarbonate resin can be employed as a material for the upright wall sections 60.

A height h of each of the upright wall sections 60 is set to 10 mm (see FIG. 6). This allows a wide range to be irradiated with light by the light emitting device 1.

Each of the upright wall sections 60 has a protrusion part 60a which protrudes so as to be fitted in the frame section 40. The protrusion part 60a is fixed to the frame section 40 so as to rotate.

Note that each of the upright wall sections 60 can employ a configuration, similar to that of a typical louver, so as to rotate. For example, a movable louver device disclosed in Patent Literature 3 can be employed as the upright wall sections 60. The following description will briefly discuss a movable louver device disclosed in Patent Literature 3 with reference to FIG. 14.

Figure 14:
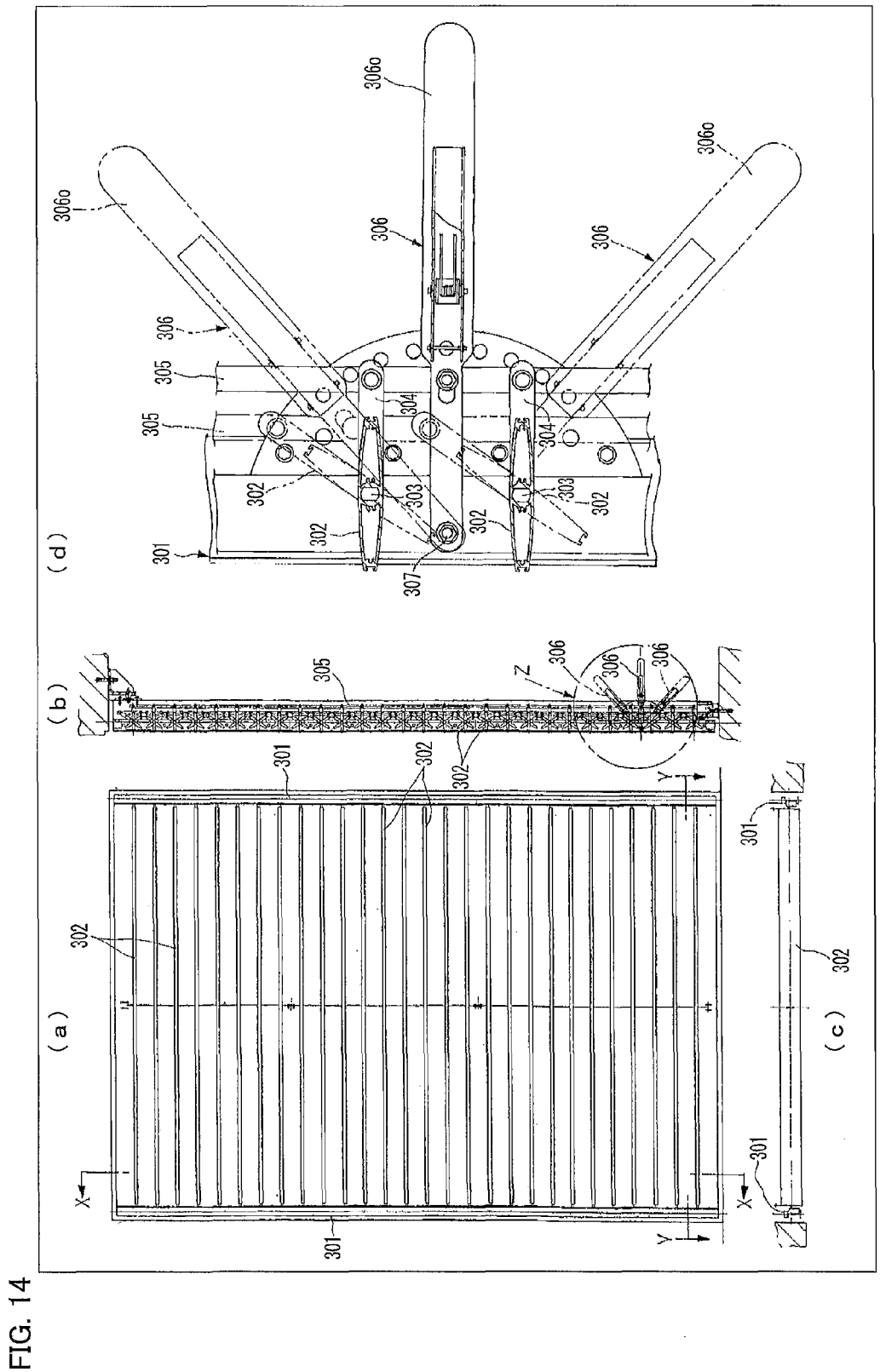
FIG. 14 is an explanatory view illustrating a configuration of a conventional movable louver. (a) of FIG. 14 is an elevation view illustrating the movable louver which is viewed from outside. (b) of FIG. 14 is a cross-sectional view illustrating a cross section taken along X-X line illustrated in (a) of FIG. 14. (c) of FIG. 14 is a cross-sectional view illustrating a cross section taken along Y-Y line illustrated in (a) of FIG. 14. (d) of FIG. 14 is an enlarged view illustrating in detail part of the cross section illustrated in (b) of FIG. 14, which part is indicated by an arrow Z illustrated in (a) of FIG. 14.

The movable louver device is configured so that louvers 302 are arranged in a multistage manner between vertical frames 301 which are provided on respective left and right sides of the louvers 302 (see FIG. 14). Each of the louvers 302 has both end parts which are provided to the vertical frames 301 via respective support shafts 303 so that the louvers 302 can rotate around the respective support shafts 303. Armplates 304 are fixed to end surfaces of the respective louvers 302. Each of the armplates 304 has a protrusion part which protrudes, by a predetermined length, from an end part in a width direction of a corresponding one of the louvers 302. An end part of the protrusion part is connected to a louver interlocking rod 305 via a pivot. A louver rotating handle 306 is connected to a predetermined lower part of the louver interlocking rod 305 via a pivot. The louver rotating handle 306 has a handle part 306o which extends inward. An end part of the louver rotating handle 306 is connected to one of the vertical frames 301 at a location more outward than the support shafts 303.

With the configuration, it is possible to simultaneously rotate all of the louvers 302 by moving the louver rotating handle 306 about an end pivot part 307 in up-and-down direction. Note that locking means is provided between the louver rotating handle 306 and the one of the vertical frames 301. The locking means locks the louver rotating handle 306 after the louver rotating handle 306 is rotated by a predetermined angle.

[Modification]

Note that a surface-mounted light emitting section to be included in the light emitting device 1 described in Embodiment 1 is not limited to the surface-mounted light emitting section 10a. For example, a surface-mounted light emitting section 10b illustrated in FIG. 7 can be used instead of the surface-mounted light emitting section 10a.

Modification is identical to Embodiment 1 except that the surface-mounted light emitting section 10a is replaced with the surface-mounted light emitting section 10b. Note that configurations other than what will be described below in Modification are identical to those of Embodiment 1. For convenience, identical reference numerals are given to members having respective functions identical to those illustrated in the drawings of Embodiment 1, and their descriptions are omitted in Modification.

(Surface-Mounted Light Emitting Section)

The surface-mounted light emitting section 10a described in Embodiment 1 includes at least one (1) blue LED chip 14a having a peak wavelength which falls within a range from 400 nm to 480 nm so as to match an absorption peak of chlorophyll in blue region.

In contrast, the surface-mounted light emitting section 10*b* of Modification includes at least two kinds of blue LED chips having respective different peak wavelengths of a plurality of peak wavelengths of light which is absorbed by a plant for photosynthesis, the different peak wavelengths falling within a short wavelength range. That is, a blue LED chip 14*a* generates first light having a peak wavelength (first peak wavelength) which falls within a range from 400 nm to 480 nm in a short wavelength range so as to match an absorption peak of chlorophyll b in blue region. A blue LED chip 14*b* for chlorophyll a generates second light having a peak wavelength (second peak wavelength) which falls within a range from 400 nm to 450 nm in a short wavelength range so as to match an absorption peak of chlorophyll a in blue region.

Figure 7:
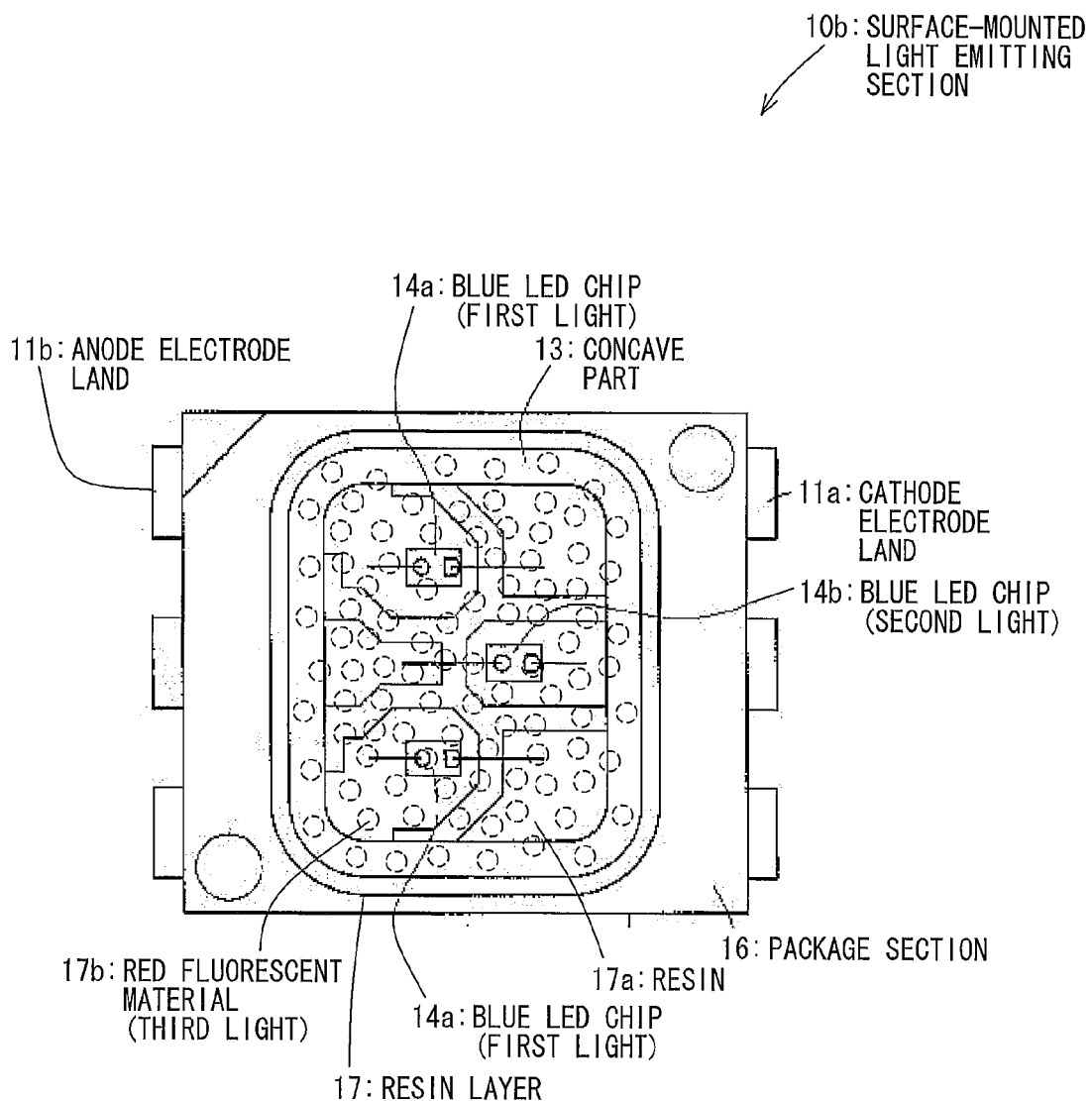
FIG. 7 is a plan view illustrating an example of a surface-mounted light emitting section according to Modification.

The following description will discuss an example of the surface-mounted light emitting section 10*b* with reference to FIG. 7.

FIG. 7 is a plan view illustrating the example of the surface-mounted light emitting section 10*b*. The surface-mounted light emitting section 10*b* has cathode electrode lands 11*a* and anode electrode lands 11*b*, each of which serves as an external terminal for surface mounting. The surface-mounted light emitting section 10*b* includes (i) a package section 16, (ii) a concave part 13 provided in the package section 16, (iii) a resin layer 17 (a sealing resin that contains a fluorescent material) made of silicone resin 17*a* that contains red fluorescent materials 17*b*, and (iv) two blue LED chips 14*a*, and (v) one (1) blue LED chip 14*b*. The package section 16 is formed in an appropriate shape in accordance with (i) a shape of the surface-mounted light emitting section 10*b* and (ii) a shape of an opening part of the concave part 13. The resin layer 17 fills in the concave part 13 so as to cover upper parts of the respective blue LED chips 14*a* and an upper part of the blue LED chip 14*b* (see FIG. 7).

The red fluorescent materials 17*b* absorb (i) light emitted from the blue LED chips 14*a* and (ii) light emitted from the blue LED chip 14*b* so as to generate third light matching a third peak wavelength of a plurality of peak wavelengths, the third peak wavelength falling within a range from 620 nm to 700 nm in a long wavelength range. The third light has an emission peak matching an absorption peak of chlorophyll a in red region and an absorption peak of chlorophyll b in red region.

Note that the above description has discussed a case where the surface-mounted light emitting section 10*b* includes two blue LED chips 14*a* and one (1) blue LED chip 14*b*. Note, however, that the number of blue LED chips 14*a* and 14*b* is not limited to such, provided that, as has been described, at least one (1) blue LED chip 14*a* and one (1) blue LED chip 14*b* are included.

Chlorophyll a and chlorophyll b will be described below.

A plant contains chlorophyll a and chlorophyll b. Specifically, chlorophyll a and chlorophyll b are contained in each of a blue range and a red range of chlorophyll.

Note here that, as illustrated in FIG. 5, chlorophyll a and chlorophyll b in the blue range are different from each other in light absorbent characteristic. Specifically, chlorophyll a in the blue range has an absorption peak which (i) falls within a range from 400 nm to 450 nm and (ii) is maximized in the vicinity of 420 nm. Chlorophyll b in the blue range has an absorption peak which (i) falls within a range from 400 nm to 480 nm and (ii) is maximized in the vicinity of 460 nm. Since a wavelength spectrum of a blue LED is sharp, a single kind of blue LED cannot cover a blue absorption range. It is therefore preferable to employ two kinds of blue LEDs (which emit respective of first light and second light) for respective of chlorophyll a and chlorophyll b in the blue range.

Chlorophyll a and chlorophyll b in the red range have respective different absorption peaks in a range from 620 nm to 700 nm. Note that, since a spectrum of a fluorescent material is broad, it is possible to cover a red absorption range.

As such, thanks to the surface-mounted light emitting section 10*b*, it is possible to realize a light emitting device which more matches the absorption peaks of chlorophyll.

[Embodiment 2]

Figure 8:
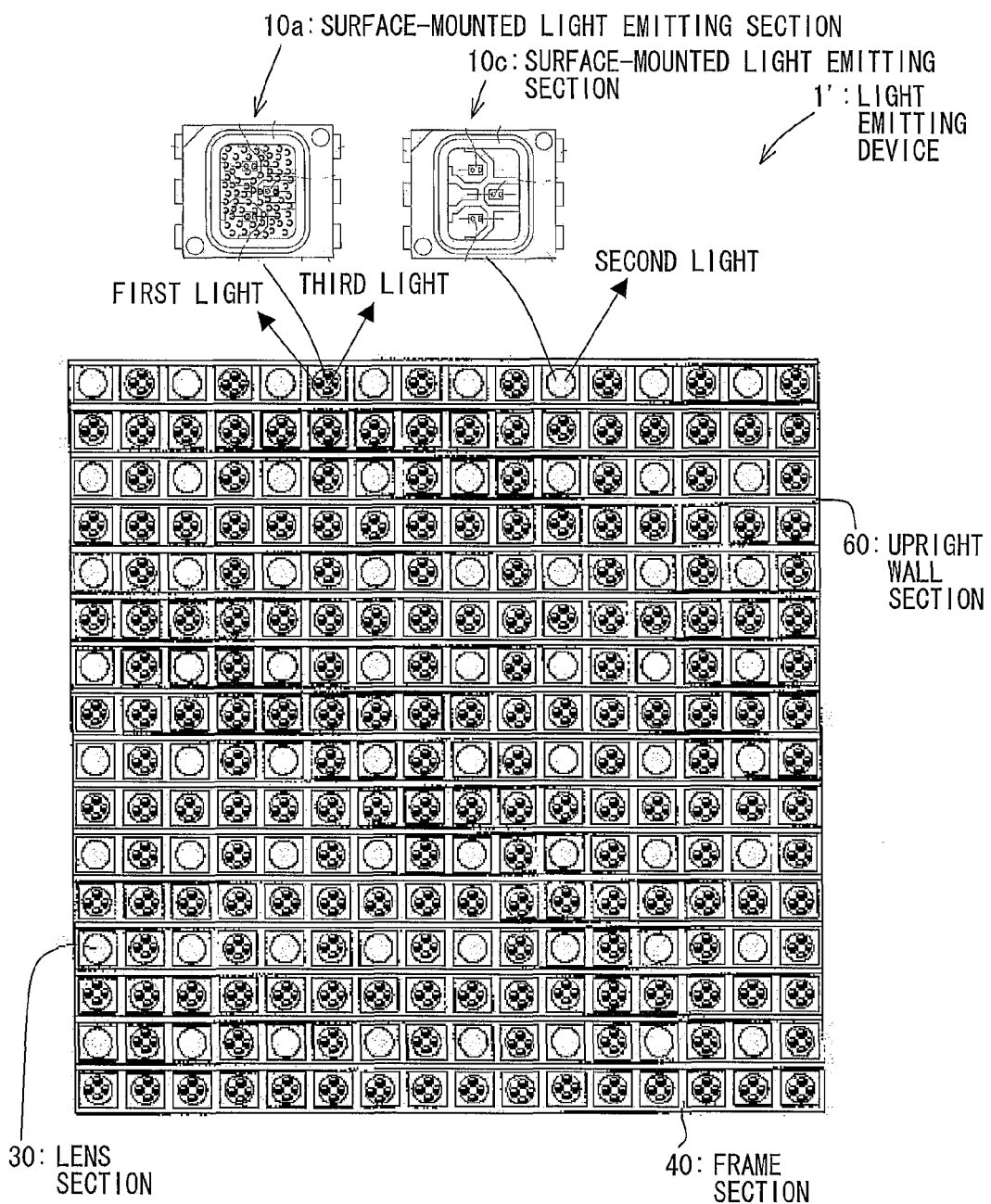
FIG. 8 is an elevation view schematically illustrating a light emitting device according to Embodiment 2.
Figure 9:
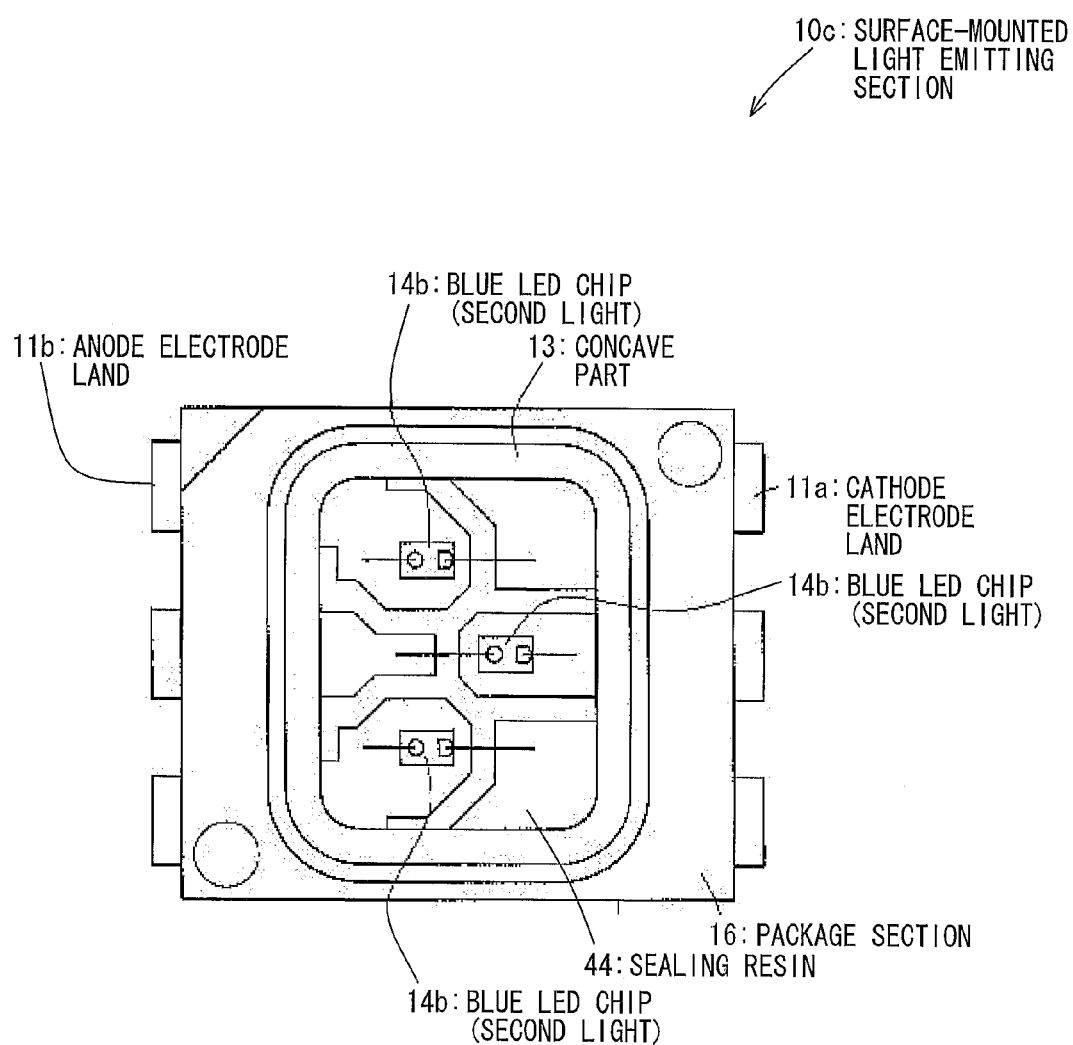
FIG. 9 is a plan view illustrating a surface-mounted light emitting section according to Embodiment 2.

The following description will discuss Embodiment 2 of the present invention with reference to FIGS. 8 and 9. Note that configurations other than what will be described below in Embodiment 2 are identical to those of Embodiment 1. For convenience, identical reference numerals are given to members having respective functions identical to those illustrated in the drawings of Embodiment 1, and their descriptions are omitted in Embodiment 2.

(Light Emitting Device)

FIG. 8 is an elevation view schematically illustrating a light emitting device 1' of Embodiment 2 in accordance with the present invention.

According to the light emitting device 1' of Embodiment 2, surface-mounted light emitting sections 10*c* (see FIG. 9 for details) are dispersedly arranged so that some of a plurality of two-dimensionally arranged surface-mounted light emitting sections 10*a* are replaced with the surface-mounted light emitting sections 10*c*. Configurations other than such a disperse arrangement are identical to those of the light emitting device 1 illustrated in FIG. 1.

(Surface-Mounted Light Emitting Section)

A configuration of each of the surface-mounted light emitting sections 10*a* included in the light emitting device 1' is identical to that described in Embodiment 1. Therefore, description of the configuration is omitted. Only a configuration of each of the surface-mounted light emitting sections 10*c* will be described below with reference to FIG. 9.

FIG. 9 is a plan view illustrating a surface-mounted light emitting section 10*c* to be provided in the light emitting device 1' of Embodiment 2 in accordance with the present invention.

The surface-mounted light emitting section 10*c* has cathode electrode lands 11*a* and anode electrode lands 11*b*, each of which serves as an external terminal for surface mounting. The surface-mounted light emitting section 10*c* includes (i) a package section 16, (ii) a concave part 13 provided in the package section 16, (iii) a sealing resin 44, and (iv) three blue LED chips 14*b* each of which emits blue light. The package section 16 is formed in an appropriate shape in accordance with (i) a shape of the surface-mounted light emitting section 10*a* or 10*b* and (ii) a shape of an opening part of the concave part 13. The sealing resin 44 is provided in the concave part 13, and is made of silicone resin. Specifically, the sealing resin 44 fills in the concave part 13 so as to cover upper parts of the respective blue LED chips 14*b* (see FIG. 9).

As has been described, each of the blue LED chips 14*b* generates second light that matches a peak wavelength of a plurality of peak wavelengths, the peak wavelength falling within a range from 400 nm to 450 nm. A second wavelength of the second light matches the absorption peak of chlorophyll a in blue region. It follows that each of the blue LED chips 14*b*, which generates the second light that matches the peak wavelength of the plurality of peak wavelengths, the peak wavelength falling within the range from 400 nm to 450 nm, serves as a blue LED chip for chlorophyll a.

Note that living organisms (such as plants) have respective different absorption peaks in blue region (different absorption efficiencies). According to Embodiment 2, the blue LED chips 14*b* are independently provided, each of which emits the second light, so as to interpolate such different absorption peaks in blue region. This brings about an effect of being able to easily adjust the second light so that the second light matches (i) the absorption peak of chlorophyll a in blue region and (ii) the absorption peak of chlorophyll b in blue region.

As such, thanks to the surface-mounted light emitting sections 10a and the surface-mounted light emitting sections 10c, it is possible to realize a light emitting device which emits light so as to match the absorption peaks of chlorophyll.

Note that the above description has discussed a case where each of the surface-mounted light emitting sections 10c includes three blue LED chips 14b. Note, however, that the number of the blue LED chips 14b included in each of the surface-mounted light emitting sections 10c is not limited to three, provided that at least one (1) blue LED chip 14b is provided.

[Comparison with Conventional Techniques]

The configuration of each light source disclosed in Patent Literature 1 and 2 causes a problem that the each light source has an insufficient luminance in front of the each light source.

A plant growing device disclosed in Patent Literature 1 determines a kind of plant to be irradiated with light, and sets, in accordance with the kind of plant thus determined, a spectrum of light to be emitted. Patent Literature 1 discloses that the plant growing device includes various kinds of LEDs so as to set a spectrum of light suitable for each of various kinds of plant. This causes an increase in the number of LEDs to be provided, an increase in area where the LEDs are provided, and ultimately an increase in cost.

An LED light source for plant cultivation, disclosed in Patent Literature 2, includes a red LED and a blue LED.

According to Patent Literature 2, quantity of light of the blue LED is set to not more than half of that of light of the red LED. In order to set the quantity of light of the blue LED to not more than half of that of light of the red LED, it is generally necessary to take, for example, the following measure (A), (B) or (C):

(A) increase in luminance of the red LED which emits high (increase in driving electric current);

(B) increase in the number of red LED chips to be provided in each LED; or (C) increase in the number of red LEDs.

This causes the following problems (1) through (3).

(1) In a case where individual blue LEDs and individual red LEDs are used, it is remarkably difficult to simultaneously (i) satisfy a predetermined ratio of light quantities and (ii) realize light in which red light and blue light are uniformly mixed without any spatial color unevenness. It is therefore difficult to obtain a mixed color necessary for plant cultivation.

Furthermore, a conventional light emitting device had a problem of having an insufficient luminance in front of the conventional light emitting device.

That is, the conventional light emitting device had a low performance of irradiation.

(2) In a case of (A) above, a difference in deterioration characteristic between a blue LED chip and a red LED chip is enhanced. Therefore, the red LED chip easily deteriorates during long-term driving.

It is necessary to adjust a ratio between blue light quantity and red light quantity. In a case where such a ratio is adjusted by adjusting the number of blue LEDs or the number of red LEDs, a difference in deterioration characteristic between the blue LED and the red LED causes a deviation of the ratio during long-term driving.

That is, the conventional light emitting device has a low weather resistance.

(3) In a case of (B) or (C) above, it is necessary to provide many red LED chips or red LEDs. However, the red LED chip is expensive. The red LED chip does not excel in temperature characteristic, either. This causes an emission efficiency to vary depending on temperature. Specifically, as temperature increases, the emission efficiency becomes worse.

Light having a short wavelength has a low transmittance to resin. Therefore, the LED light source for plant cultivation, which includes an epoxy resin lens (see Patent Literature 2), emits weak light having a short wavelength (such as blue light).

That is, the conventional light emitting device has a low reliability.

Figure 11:
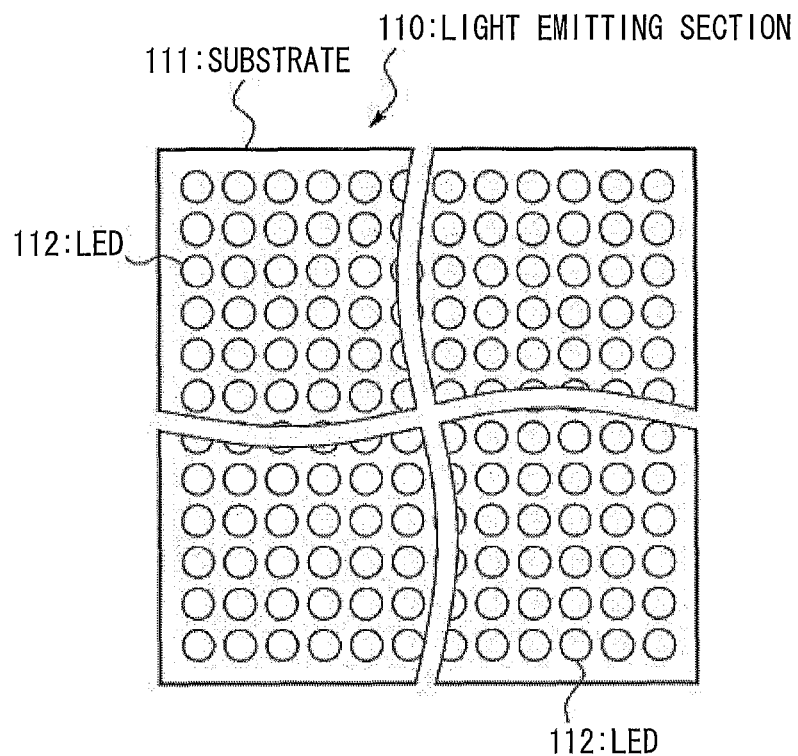
FIG. 11 is a plan view illustrating a light irradiation section included in the plant growing device.
Figure 12:
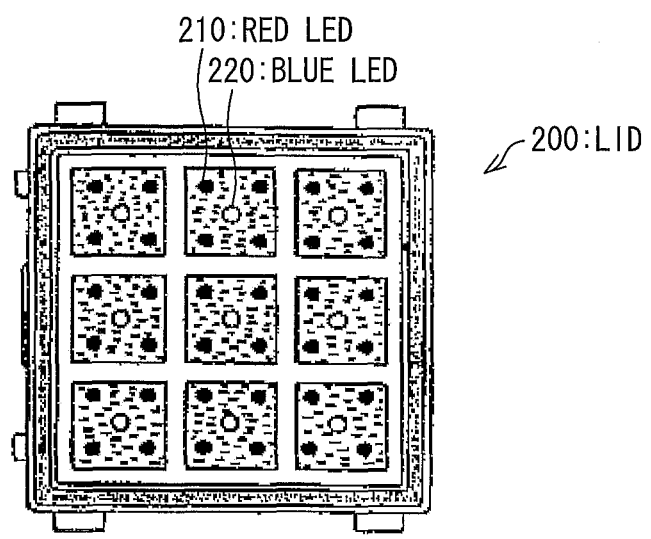
FIG. 12 is a plan view illustrating a conventional LED light source for plant cultivation.

The following description will discuss how the present invention is more excellent than the conventional techniques. With reference to Table 1, a comparison will be made between (i) the surface-mounted light emitting sections 10a, 10b, and 10c of Embodiments above and (ii) a combination of a conventional bullet-shaped red LED lamp and a conventional bullet-shaped blue LED lamp (for example, LEDs 112 (see FIGS. 10 and 11), or LEDs 210 and LEDs 220 (see FIGS. 12 and 13)).

TABLE 1

| | Present Invention Surface-mounted light emitting section | Conventional Example Bullet-shaped red LED lamp and Bullet-shaped blue LED lamp |
|---|---|---|
| Material | Ceramic substrate and Silicone resin | Epoxy resin |
| Reliability | Make less deterioration because no epoxy resin is used, and therefore reliability is improved. | Depend on life duration of a red LED chip. Light having a short wavelength has a low transmittance to resin. |
| Cost | Processing cost is reduced because, by controlling quantity of resin that contains a fluorescent material, it is possible to raise a yield at which an optimal chromaticity is attained. Mounting cost is reduced because it is possible to provide a single kind of blue LED chips in one (1) package by use of a high-density mount technique. Cost reduction is attained because a red fluorescent material is used instead of a red LED chip. | A red LED chip is expensive (for example, a high-power red LED chip for an illumination device is twice or more as expensive as a blue LED chip). |
| Characteristic | Temperature characteristic is improved (by approximately 10%), because no red LED chip is used. | A red LED chip has an unsatisfactory temperature characteristic. |
| Area for Mounting | Approximately ⅙ (in a case where the area is assumed to be 1 in Conventional Example) | 1 |
| Life Duration | Atmospheric temperature: 50° C., Approximately 40,000 hours | Atmospheric temperature: 50° C., Approximately 5,000 hours |

As is clear from Table 1, the surface-mounted light emitting sections 10a, 10b, and 10c of Embodiments above excel in all of reliability, cost, characteristic, area, and life duration, as compared with the combination of the conventional bullet-shaped red LED lamp and the conventional bullet-shaped blue LED lamp.

Specifically, as to the reliability, since no epoxy resin is used, the surface-mounted light emitting sections 10a, 10b, and 10c bring about an effect of being able to make less resin deterioration.

As is clear from the cost in Table 1, the surface-mounted light emitting sections 10a, 10b, and 10c have an advantage in cost, as compared with Conventional Example.

As is clear from the characteristic in Table 1, the surface-mounted light emitting sections 10a, 10b, and 10c can improve a temperature characteristic by approximately 10% because no red LED chip is used.

As is clear from the area in Table 1, in a case where a first area, in which the conventional bullet-shaped red LED lamp and the conventional bullet-shaped blue LED lamp are provided, is assumed to be 1 (one), a second area, in which the surface-mounted light emitting sections 10a, 10b and/or 10c are provided, is ⅙ as large as the first area. As such, according to the surface-mounted light emitting sections 10a, 10b and/or 10c, a smaller area is required, as compared with the first area.

As is clear from the life duration in Table 1, since each of the surface-mounted light emitting sections 10a, 10b and 10c has a life duration of 30,000 to 40,000 hours, the life duration is not less than ten times as long as that of, not to mention an electrothermal lamp (lightbulb), a fluorescent lamp.

[Supplementary Description]

Note here that the above description has discussed chlorophyll as a pigment. Note, however, that the pigment is not limited to chlorophyll, and can therefore be a photosynthetic pigment such as carotenoid or phycobilin. Examples of a living organism include photoheterotroph such as (i) photosynthetic bacteria and (ii) plants such as blue-green algae, red algae, diatoms, brown algae, green algae, and seed plants (bryophytes and ferns).

The present invention is not limited to the description of the embodiments above, and can therefore be modified by a skilled person in the art within the scope of the claims. Namely, an embodiment derived from a proper combination of technical means disclosed in different embodiments is encompassed in the technical scope of the present invention.

It is preferable to configure the light emitting device of the present invention such that the lens sections and the frame section are integrated with each other so as to serve as a lens array module.

It is preferable to configure the light emitting device of the present invention such that the lens sections are arranged in a dot matrix manner, and the frame section has a lattice shape.

It is preferable to configure the light emitting device of the present invention to include movable upright wall sections which are provided in accordance with an arrangement of the frame section, each of the upright wall sections having a protrusion part which is fitted in the frame section.

It is preferable to configure the surface-mounted light emitting section of the present invention to include (i) at least one (1) first blue LED chip having a peak wavelength which falls within a range from 400 nm to 450 nm so as to match an absorption peak of chlorophyll in blue region, (ii) at least one (1) second blue LED chip having a peak wavelength which falls within a range from 400 nm to 480 nm so as to match the absorption peak of chlorophyll in blue region, (iii) red fluorescent materials each of which emits, in response to excitation light emitted from the at least first and second blue LED chips, light having a peak wavelength which falls within a range from 620 nm to 700 nm so as to match an absorption peak of chlorophyll in red region, and (iv) a resin layer in which the red fluorescent materials are dispersed, the resin layer covering the at least first and second blue LED chips.

It is preferable to configure the surface-mounted light emitting section of the present invention such that the at least first blue LED chip which is covered with a light-transmitting sealing resin and the red fluorescent materials are provided individually.

It is preferable to configure the surface-mounted light emitting section of the present invention such that a ratio between (i) a photosynthetic photon flux in a blue range in which a wavelength falls within a range from 400 nm to 480 nm and (ii) a photosynthetic photon flux in a red range in which a wavelength falls within a range from 620 nm to 700 nm, falls within a range from 1:1.3 to 1:10. According to the configuration, it is possible to realize a surface-mounted light emitting section which is suitable for germination of plants, raising of seedlings of plants, and cultivation of plants.

It is preferable to configure the surface-mounted light emitting section of the present invention to emit (i) first light having a peak wavelength which falls within a range from 400 nm to 480 nm and (ii) third light having a peak wavelength which falls within a range from 620 nm to 700 nm.

The surface-mounted light emitting section of the present invention can be configured to include (i) at least one (1) LED chip which emits second light that matches a peak wavelength of a plurality of peak wavelengths of light which is absorbed by a plant for photosynthesis, the peak wavelength falling within a range from 400 nm to 450 nm in a short wavelength range, and (ii) a sealing resin which covers the at least one LED chip. Note that the sealing resin can be silicone resin.

The light emitting device of the present invention can be configured to include (i) at least one (1) first surface-mounted light emitting section which is provided on a surface of a wiring substrate and emits first light and third light, (ii) at least one (1) second surface-mounted light emitting section which is provided on the surface of the wiring substrate and emits second light, (iii) lens sections which are provided on light exit sides of respective of the at least first surface-mounted light emitting section and the at least second surface-mounted light emitting section, and (iv) a frame section which fixes peripheries of the lens sections.

Note that the technical scope of the present invention encompasses a light irradiation apparatus which includes the light emitting device of the present invention as a light source for growing of living organisms, the growing including cultivation or culturing.

Figure 10:
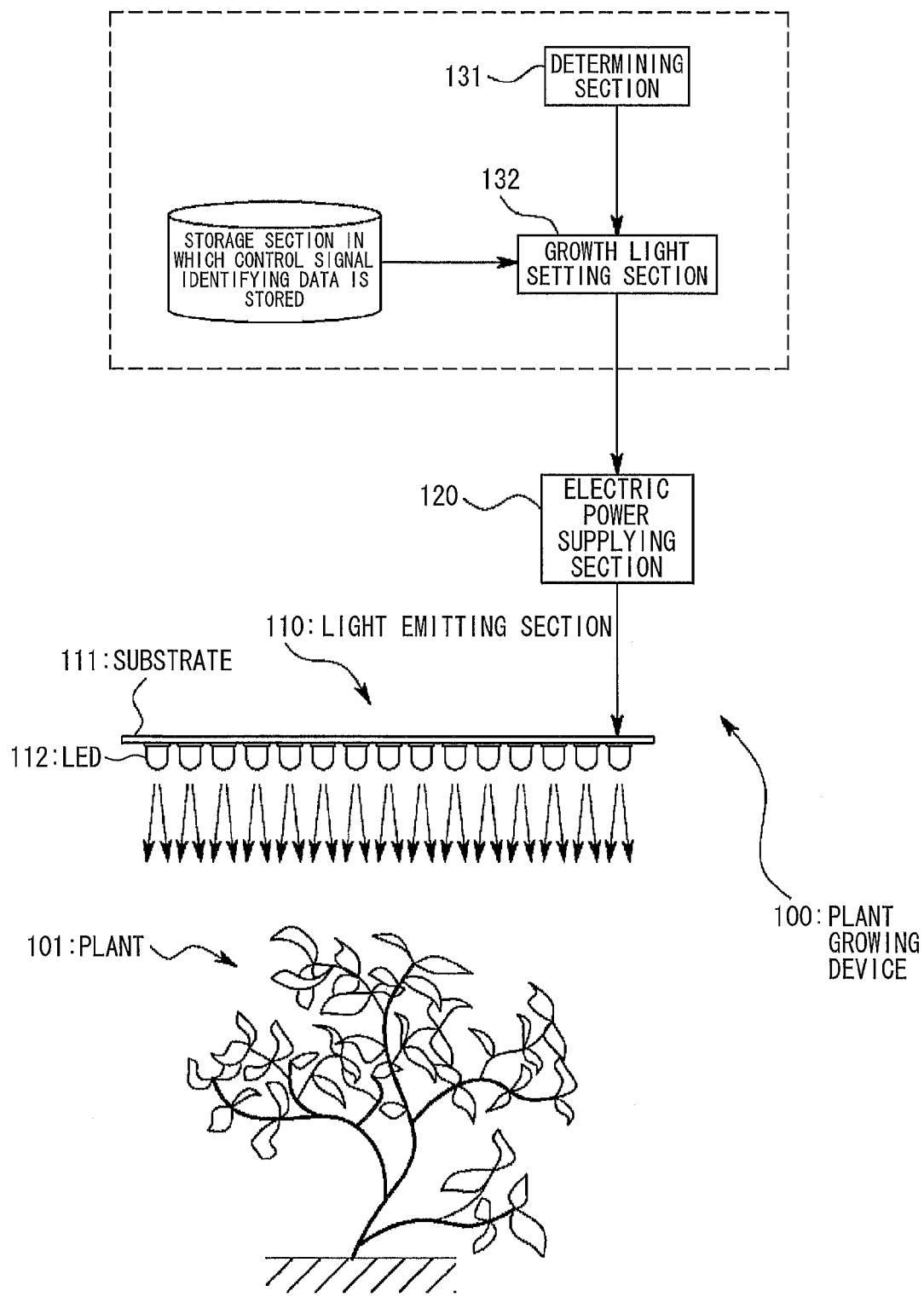
FIG. 10 is a view schematically illustrating a configuration of a conventional plant growing device.
Figure 13:
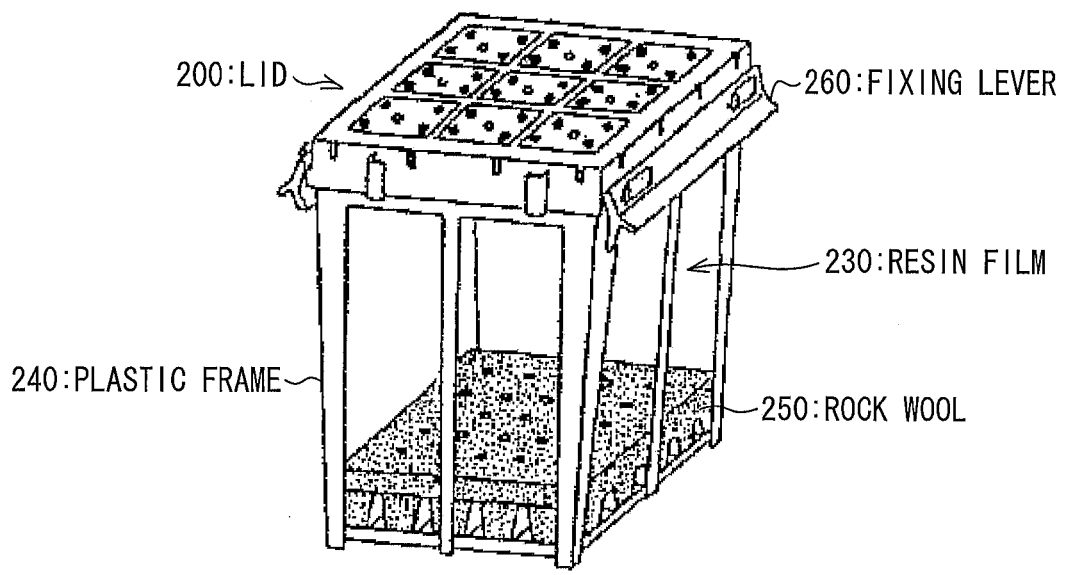
FIG. 13 is a perspective view illustrating a cultivation vessel with which the LED light source is combined.

Note that the light irradiation apparatus can employ a configuration illustrated in FIG. 10 or FIG. 13. The irradiation apparatus can alternatively employ various modified configurations such as a configuration in which the light irradiation apparatus is configured to irradiate a tall plant with light from a side surface of the tall plant.

The light emitting device of the present invention will be supplementally described below.

It is preferable to configure the light emitting device of the present invention such that the at least one surface-mounted light emitting section includes at least one (1) second LED chip which emits second light which matches a second peak wavelength of the plurality of peak wavelengths, the second peak wavelength (i) falling within the relatively short wavelength range and (ii) being different from the first peak wavelength.

For example, a living organism that contains chlorophyll a and chlorophyll b is known as a living organism which requires light to grow. Chlorophyll a and chlorophyll b are different from each other in light absorption characteristic in a short wavelength range (such as a blue range). Specifically, for example, chlorophyll a has an absorption peak that matches the second peak wavelength in the short wavelength range, and chlorophyll b has an absorption peak that matches the first peak wavelength in the short wavelength range.

According to the configuration, it is possible to emit (i) the first light that matches the first peak wavelength and (ii) the second light that matches the second peak wavelength which is different from the first peak wavelength, so as to match respective light absorption characteristics of chlorophyll a and chlorophyll b in the short wavelength range.

Therefore, it is thus possible to provide a light emitting device which is more suitable for growing of, for example, the living organism that contains chlorophyll a and chlorophyll b.

The above example is generalized to be described in different words as follows: it is possible to provide a light emitting device which is more suitable for a living organism that has a plurality of absorption peaks in a short wavelength range among living organisms which absorb light to grow.

It is preferable to configure the light emitting device of the present invention such that the lens section and the frame section are integrated with each other so as to serve as a lens module.

According to the configuration, the lens section and the frame section are integrated with each other. This allows a connection structure to be simplified. It is therefore possible to improve (i) workability during connecting (mounting) or exchanging on a maintenance work. Thanks to an easy connecting operation, it is possible to reduce the possibility of erroneously connecting the lens module. This allows reliability to be improved.

It is preferable to configure the light emitting device of the present invention such that a plurality of surface-mounted light emitting sections, including the at least one surface-mounted light emitting section, are provided in a matrix manner, the frame section has a lattice shape so as to correspond to the plurality of surface-mounted light emitting sections, and the lens section is provided for each compartment of the frame section in the lattice shape.

The at least one surface-mounted light emitting section has an area smaller than that of a conventional light source. Therefore, the light emitting device, which includes the plurality of surface-mounted light emitting sections which are provided in the matrix manner, can be downsized.

It is preferable to configure the light emitting device of the present invention such that upright wall sections, which are upright from the frame section toward the light exit side, are successively arranged along a row direction of the plurality of surface-mounted light emitting sections, an upright wall section being provided between respective adjacent surface-mounted light emitting sections provided in a column direction that intersects the row direction.

What is meant by "respective adjacent surface-mounted light emitting sections provided in a column direction that intersects the row direction" are, for example, (i) a first surface-mounted light emitting section which is provided in the first column and in the first row and (ii) a second surface-mounted light emitting section which is provided in the first column and in the second row. The first and second surface-mounted light emitting sections are adjacent to each other along the column direction.

According to the configuration, the upright wall sections are successively arranged along the row direction, the upright wall section being provided between the respective adjacent surface-mounted light emitting sections provided in the column direction. Therefore, for example, in a case where the light emitting device is placed so that the column direction is parallel to the gravity direction, the row direction is parallel to a horizontal direction. In this case, each of the upright wall sections serves as a visor-shaped structure for the surface-mounted light emitting sections which are arranged along the row direction.

That is, each of the upright wall sections functions to (i) cause more light to exit in front of the light emitting device and (ii) enhance directivity of light in front of the light emitting device.

Note that the above description has dealt with an example case where the column direction is parallel to the gravity direction. The light emitting device can alternatively be placed so that the column direction is parallel to any direction. Even in a case where the light emitting device is placed so that the column direction is parallel to any direction, it is possible to enhance directivity of light in front of the light emitting device.

It is preferable to configure the light emitting device of the present invention such that each of the upright wall sections is configured to rotate between (i) a state in which the upright wall section is upright and (ii) a state in which the upright wall section is slanted to the surface of the wiring substrate.

According to the configuration, it is possible to adjust an angle of each of the upright wall sections between (i) the state in which the upright wall section is upright and (ii) the state in which the upright wall section is slanted to the surface of the wiring substrate. It is therefore possible to appropriately adjust, in accordance with, for example, three-dimensional growth of a plant, an angle at which the plant is irradiated with light. This can bring about an effect of increasing a light irradiation intensity at any stage of growth of the plant.

Moreover, in a case where a plurality of living organisms to be grown are (i) arranged on a horizontal plane and (ii) irradiated with light, it is possible to adjust angles at which the respective plurality of living organisms are irradiated with light, as appropriate in accordance with the arrangements of the respective plurality of living organisms.

It is preferable to configure the light emitting device of the present invention such that a first wavelength of the first light falls within a range from 400 nm to 480 nm, and a third wavelength of the third light falls within a range from 620 nm to 700 nm.

The at least one first LED chip has an emission peak wavelength in the range from 400 nm to 480 nm so as to match an absorption peak of chlorophyll in blue region. The fluorescent material has an emission peak wavelength in the range from 620 nm to 700 nm so as to match an absorption peak of chlorophyll in red region.

According to the configuration, the light emitting device of the present invention can emit light necessary for growth of a living organism that contains chlorophyll, that is, light that matches the absorption peak of chlorophyll in blue region and light that matches the absorption peak of chlorophyll in red region.

It is preferable to configure the light emitting device of the present invention such that a second wavelength of the second light falls within a range from 400 nm to 450 nm.

Chlorophyll a has an absorption peak, in blue range, which falls within the range from 400 nm to 450 nm. Chlorophyll b has an absorption peak, in blue range, which falls within the range from 400 nm to 480 nm.

According to the configuration, it is possible to emit beams of light which match respective two different light absorption characteristics of chlorophyll a and chlorophyll b in the blue range. It is therefore possible to provide a light emitting device which is more suitable for growing of a living organism that contains chlorophyll a and chlorophyll b.

It is preferable to configure the light emitting device of the present invention such that the at least one surface-mounted light emitting section has an opening part in a rectangular shape having short sides and long sides, via which opening part light that contains the first light and the third light is emitted.

The configuration makes it possible to (i) increase light quantity in a direction parallel to the long sides and (ii) attain a satisfactory color mixture of light in the direction parallel to the long sides. For example, in a case where the light emitting device is placed so that the direction parallel to the long sides is parallel to the gravity direction, it is possible to irradiate a plant from top to bottom with plentiful light whose color mixture is satisfactory. This brings an advantage to growth of the plant.

In order to attain the object, a light irradiation apparatus of the present invention is configured to include the above-described light emitting device as a light source for growing of living organisms, the growing including cultivation or culturing.

According to the configuration, it is possible to provide a light irradiation apparatus including a light emitting device which (i) does not increase an area where the light emitting device is provided and (ii) attains a satisfactory color mixture of blue light and red light with a simple configuration.

INDUSTRIAL APPLICABILITY

The present invention is applicable to a light irradiation apparatus for growing such as cultivation or culturing, which light irradiation apparatus can be used in a factory such as (i) a factory where eukaryotes are grown or (ii) a factory where photosynthetic bacteria are cultured.

REFERENCE SIGNS LIST

1 and 1': Light emitting device
10a, 10b, and 10c: Surface-mounted light emitting section
14a: Blue LED chip (first LED chip)
14b: Blue LED chip (second LED chip)
17: Resin layer (sealing resin, containing a fluorescent material)
17b: Red fluorescent material (fluorescent material)
20: Wiring substrate
30: Lens section
40: Frame section
60: Upright wall section

The invention claimed is:

1. A light emitting device, comprising:
a plurality of surface-mounted light emitting sections provided in a matrix manner, the plurality of surface-mounted light emitting sections including at least one (1) surface-mounted light emitting section which is mounted on a surface of a wiring substrate;
a lens section which is provided on a light exit side of the at least one surface-mounted light emitting section;
a frame section which fixes a periphery of the lens section, the frame section having a lattice shape so as to correspond to the plurality of surface-mounted light emitting sections; and
upright wall sections being upright from the frame section toward the light exit side and successively arranged along a row direction of the plurality of surface-mounted light emitting sections, an upright wall section being provided between respective adjacent surface-mounted light emitting sections provided in a column direction that intersects the row direction,
each of the upright wall sections being configured to rotate between (i) a state in which the upright wall section is upright and (ii) a state in which the upright wall section is slanted to the surface of the wiring substrate,
the lens section being provided for each compartment of the frame section in the lattice shape, and
the at least one surface-mounted light emitting section including:
at least one (1) first LED chip which emits first light that matches a first peak wavelength of a plurality of peak wavelengths of light that is to be absorbed by living organisms that require light to grow, the first peak wavelength falling within a relatively short wavelength range; and
a sealing resin, containing a fluorescent material, which is provided so as to cover the at least one first LED chip,
the fluorescent material absorbing the first light, which is emitted by the at least one first LED chip, so as to emit third light that matches a third peak wavelength of the plurality of peak wavelengths, the third peak wavelength falling within a relatively long wavelength range.

2. The light emitting device as set forth in claim 1, wherein:
the at least one surface-mounted light emitting section includes at least one (1) second LED chip which emits second light which matches a second peak wavelength of the plurality of peak wavelengths, the second peak wavelength (i) falling within the relatively short wavelength range and (ii) being different from the first peak wavelength.

3. The light emitting device as set forth in claim 2, wherein:
a second wavelength of the second light falls within a range from 400 nm to 450 nm.

4. The light emitting device as set forth in claim 1, wherein:
the lens section and the frame section are integrated with each other so as to serve as a lens module.

5. The light emitting device as set forth in claim 1, wherein:
a first wavelength of the first light falls within a range from 400 nm to 480 nm, and
a third wavelength of the third light falls within a range from 620 nm to 700 nm.

6. The light emitting device as set forth in claim 1, wherein:
the at least one surface-mounted light emitting section has an opening part in a rectangular shape having short sides and long sides, via which opening part light that contains the first light and the third light is emitted.

7. A light irradiation apparatus, comprising a light emitting device recited in claim 1 as a light source for growing of living organisms, the growing including cultivation or culturing.

* * * * *